United States Patent
Lee et al.

(10) Patent No.: US 12,133,455 B2
(45) Date of Patent: Oct. 29, 2024

(54) POLYCYCLIC COMPOUND AND ORGANIC LIGHT EMITTING DIODE COMPRISING SAME

(71) Applicant: LG CHEM, LTD., Seoul (KR)

(72) Inventors: Ki Kon Lee, Daejeon (KR); Sang Duk Suh, Daejeon (KR); Sujeong Geum, Daejeon (KR); Moung Gon Kim, Daejeon (KR); Kyunghee Kim, Daejeon (KR); Dong Hoon Lee, Daejeon (KR); Tae Yoon Park, Daejeon (KR); Dongheon Kim, Daejeon (KR); Woochul Lee, Daejeon (KR)

(73) Assignee: LG Chem, Ltd., Seoul (KR)

( * ) Notice: Subject to any disclaimer, the term of this patent is extended or adjusted under 35 U.S.C. 154(b) by 966 days.

(21) Appl. No.: 17/056,224

(22) PCT Filed: Jun. 26, 2019

(86) PCT No.: PCT/KR2019/007704
§ 371 (c)(1),
(2) Date: Nov. 17, 2020

(87) PCT Pub. No.: WO2020/009363
PCT Pub. Date: Jan. 9, 2020

(65) Prior Publication Data
US 2021/0257550 A1 Aug. 19, 2021

(30) Foreign Application Priority Data
Jul. 3, 2018 (KR) .................. 10-2018-0077108

(51) Int. Cl.
H01L 51/50 (2006.01)
C07F 5/02 (2006.01)
(Continued)

(52) U.S. Cl.
CPC ........... H10K 85/322 (2023.02); C07F 5/027 (2013.01); C09K 11/06 (2013.01);
(Continued)

(58) Field of Classification Search
None
See application file for complete search history.

(56) References Cited

U.S. PATENT DOCUMENTS

| 2015/0159084 A1 | 6/2015 | Cho et al. |
| 2015/0270506 A1 | 9/2015 | Voges et al. |
| (Continued) | | |

FOREIGN PATENT DOCUMENTS

| CN | 107501311 | 12/2017 |
| CN | 107851724 A | 3/2018 |
| (Continued) | | |

OTHER PUBLICATIONS

Gao et al., "Realizing performance improvement of blue thermally activated delayed fluorescence molecule DABNA by introducing substituents on the paraposition of boron atom," Chemical Physics Letters 701: 98-102 (2018).

*Primary Examiner* — Gregory D Clark
(74) *Attorney, Agent, or Firm* — Bryan Cave Leighton Paisner LLP

(57) ABSTRACT

Provided is a compound of Formula 1:

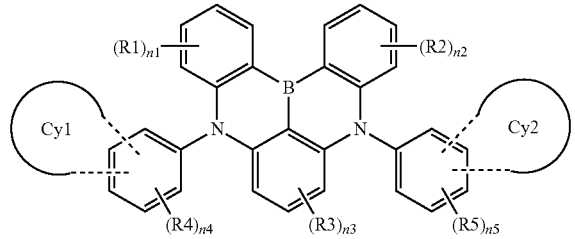

wherein:
Cy1 and Cy2 are each independently a substituted or unsubstituted hetero ring;
R1 to R5 are the same as or different from each other, and are each independently hydrogen, deuterium, a halogen group, a cyano group, a nitro group, a hydroxyl group, a carbonyl group, an ester group, an
(Continued)

imide group, an amino group, a silyl group, a boron group, a substituted or unsubstituted alkyl group, a substituted or unsubstituted cycloalkyl group, a substituted or unsubstituted aryl group, or a substituted or unsubstituted heterocyclic group;

$n1$ and $n2$ are each an integer from 0 to 4;

$n3$ to $n5$ are each an integer from 0 to 3; and when $n1$ to $n5$ are each 2 or more, two or more substituents in the parenthesis are the same as or different from each other, and an organic light emitting device including the same.

5 Claims, 4 Drawing Sheets

(51) Int. Cl.
*C09K 11/06* (2006.01)
*H10K 85/30* (2023.01)
*H10K 50/11* (2023.01)
*H10K 50/15* (2023.01)
*H10K 50/16* (2023.01)
*H10K 50/17* (2023.01)
*H10K 101/00* (2023.01)
*H10K 101/10* (2023.01)

(52) U.S. Cl.
CPC ...... *C09K 2211/1018* (2013.01); *H10K 50/11* (2023.02); *H10K 50/15* (2023.02); *H10K 50/16* (2023.02); *H10K 50/17* (2023.02); *H10K 50/171* (2023.02); *H10K 2101/10* (2023.02); *H10K 2101/90* (2023.02)

(56) References Cited

U.S. PATENT DOCUMENTS

| | | |
|---|---|---|
| 2015/0318487 A1 | 11/2015 | Ito et al. |
| 2018/0094000 A1 | 4/2018 | Hatakeyama et al. |
| 2018/0138425 A1 | 5/2018 | Ma et al. |
| 2018/0301629 A1† | 10/2018 | Hatakeyama |
| 2020/0091431 A1 | 3/2020 | Hatakeyama et al. |
| 2020/0176679 A1† | 6/2020 | Jeong |
| 2021/0066599 A1* | 3/2021 | Nakano ............. H10K 85/6576 |

FOREIGN PATENT DOCUMENTS

| | | | |
|---|---|---|---|
| CN | 110662750 A | 1/2020 | |
| EP | 3345911 A1 | 7/2018 | |
| KR | 10-2012-0116269 | 10/2012 | |
| KR | 10-2014-0012440 | 2/2014 | |
| KR | 10-2014-0049227 | 4/2014 | |
| KR | 10-2015-0067331 | 6/2015 | |
| KR | 10-2015-0126756 | 11/2015 | |
| KR | 10-2017-0122296 | 11/2017 | |
| KR | 10-2017-0130434 | * 11/2017 | ............ H01L 51/50 |
| KR | 10-2017-0130435 | 11/2017 | |
| KR | 10-2018-0054490 | 5/2018 | |
| KR | 10-1876763 | 7/2018 | |
| WO | 2012-141499 | 10/2012 | |
| WO | 2014-061991 | 4/2014 | |
| WO | 2016-152418 | 9/2016 | |
| WO | 2018/216990 A1 | 11/2018 | |

\* cited by examiner
† cited by third party

[Figure 1]
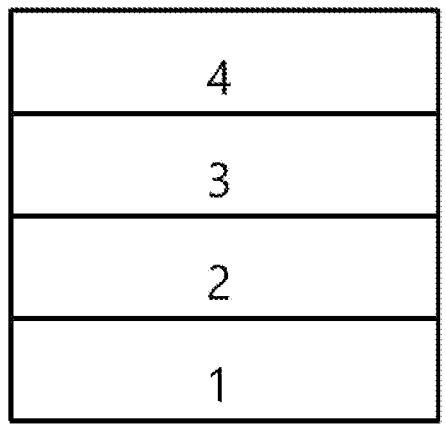
[Figure 2]
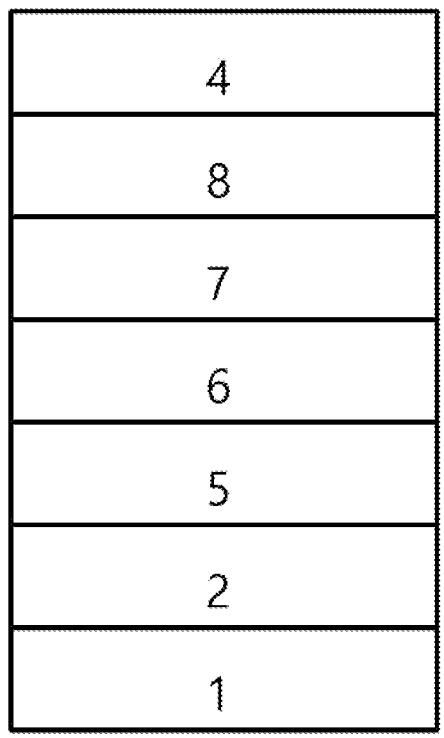

[Figure 3]
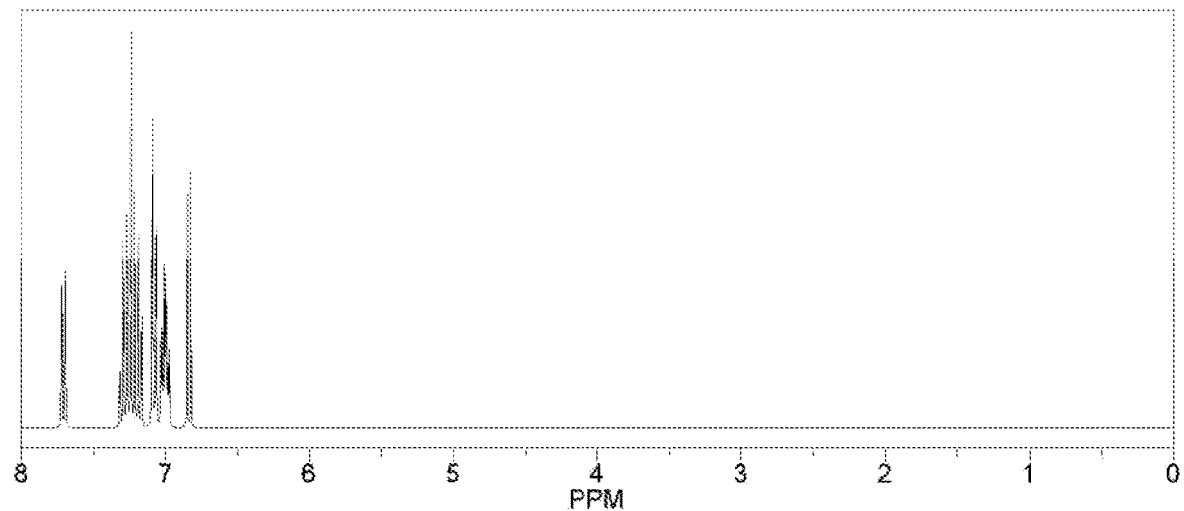
[Figure 4]
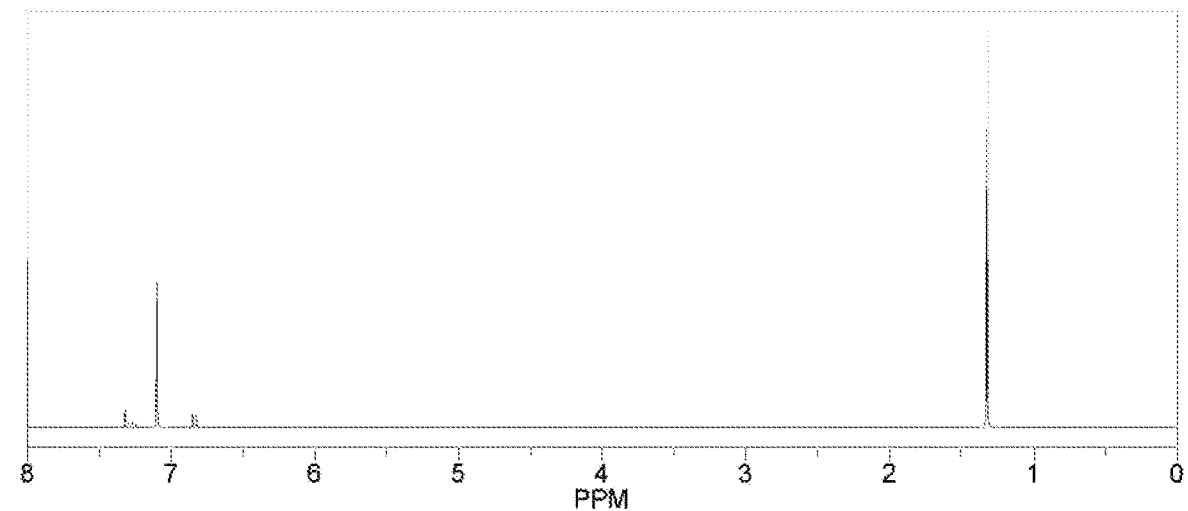

[Figure 5]
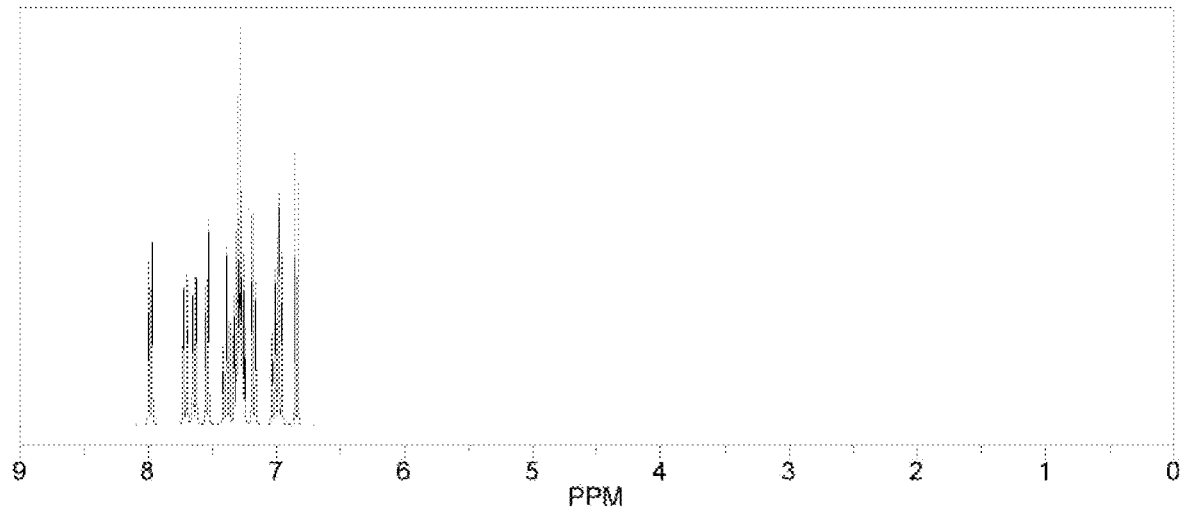
[Figure 6]
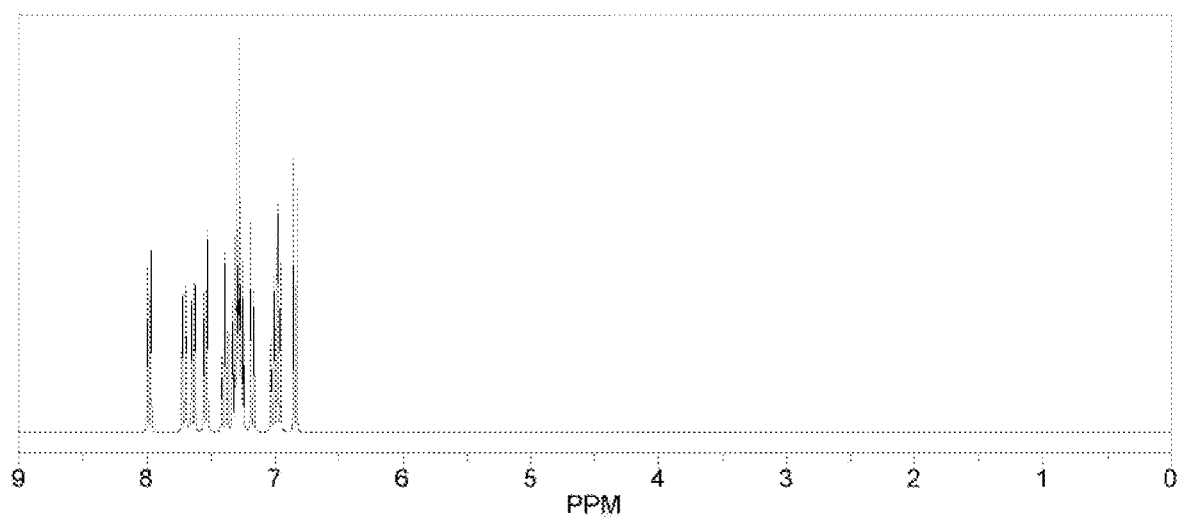

[Figure 7]
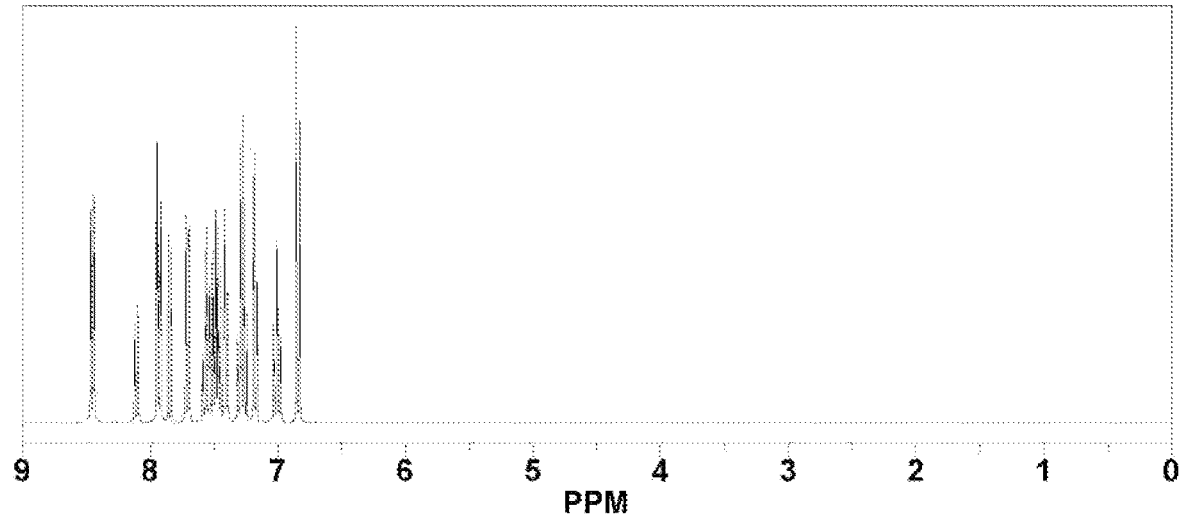
[Figure 8]
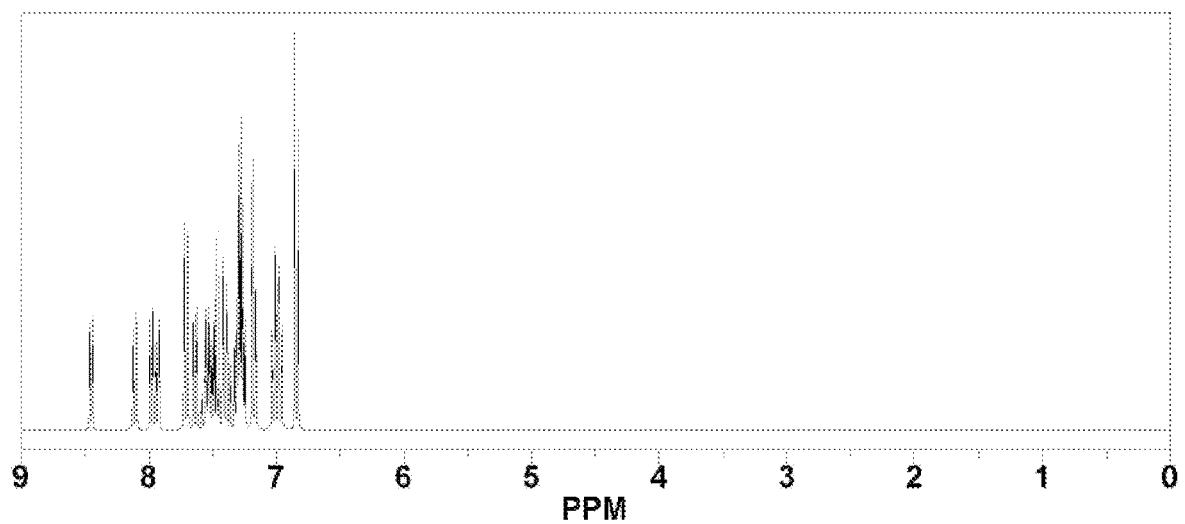

POLYCYCLIC COMPOUND AND ORGANIC LIGHT EMITTING DIODE COMPRISING SAME

CROSS-REFERENCE TO RELATED APPLICATIONS

This application is a National Stage Application of International Application No. PCT/KR2019/007704 filed on Jun. 26, 2019, which claims priority to and the benefit of Korean Patent Application No. 10-2018-0077108 filed in the Korean Intellectual Property Office on Jul. 3, 2018, the entire contents of which are incorporated herein by reference.

TECHNICAL FIELD

The present specification relates to a compound and an organic light emitting device including the same.

BACKGROUND

In the present specification, an organic light emitting device is a light emitting device using an organic semiconductor material, and requires an exchange of holes and/or electrons between electrodes and organic semiconductor materials. The organic light emitting device can be roughly divided into the following two light emitting devices depending on the operation principle. The first organic light emitting device is a light emitting device in which an exciton is formed in an organic material layer by a photon that flows from an external light source to the device, the exciton is separated into electrons and holes, and the electrons and the holes are each transferred to the different electrodes and used as a current source (voltage source). The second organic light emitting device is a light emitting device in which holes and/or electrons are injected into organic semiconductor material layers forming an interface with an electrode by applying a voltage or current to two or more electrodes, and the device is operated by the injected electrons and holes.

In general, an organic light emitting phenomenon refers to a phenomenon in which electric energy is converted into light energy by using an organic material. An organic light emitting device using the organic light emitting phenomenon usually has a structure including a positive electrode, a negative electrode, and an organic material layer interposed therebetween. Here, the organic material layer has in many cases a multi-layered structure composed of different materials in order to improve the efficiency and stability of the organic light emitting device, and for example, can be composed of a hole injection layer, a hole transport layer, a light emitting layer, an electron blocking layer, an electron transport layer, an electron injection layer, and the like. In such a structure of the organic light emitting device, if a voltage is applied between the two electrodes, holes are injected from the positive electrode into the organic material layer and electrons are injected from the negative electrode into the organic material layer, and when the injected holes and electrons meet each other, an exciton is formed, and light is emitted when the exciton falls down again to a ground state. Such an organic light emitting device has been known to have characteristics such as self-emission, high brightness, high efficiency, a low driving voltage, a wide viewing angle, and high contrast.

In an organic light emitting device, materials used as an organic material layer can be classified into a light emitting material and a charge transport material, for example, a hole injection material, a hole transport material, an electron blocking material, an electron transport material, an electron injection material, and the like depending on the function. The light emitting materials include blue, green, and red light emitting materials according to the light emitting color, and yellow and orange light emitting materials required for implementing a much better natural color.

Furthermore, a host/dopant system can be used as a light emitting material for the purpose of enhancing color purity and light emitting efficiency through energy transfer. The principle is that when a small amount of dopant which has a smaller energy band and better light emitting efficiency than those of a host mainly constituting a light emitting layer is mixed with the light emitting layer, the excitons generated by the host are transported to the dopant to emit light with high efficiency. In this case, it is possible to obtain light with a desired wavelength according to the type of dopant used because the wavelength of the host moves to the wavelength range of the dopant.

In order to fully exhibit the aforementioned excellent characteristics of the organic light emitting device, materials constituting an organic material layer in the device, for example, a hole injection material, a hole transport material, a light emitting material, an electron blocking material, an electron transport material, an electron injection material, and the like need to be supported by stable and efficient materials, so that there is a continuous need for developing a new material.

BRIEF DESCRIPTION

Technical Problem

The present specification describes a compound and an organic light emitting device including the same.

Technical Solution

An exemplary embodiment of the present specification provides a compound of Formula 1:

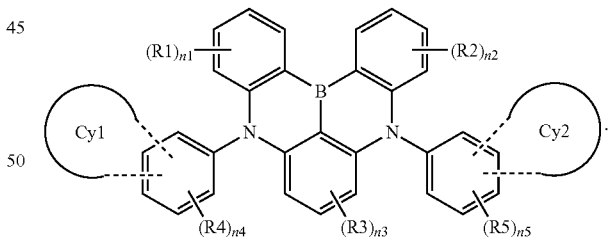

Formula 1

In Formula 1:
Cy1 and Cy2 are the same as or different from each other, and are each independently a substituted or unsubstituted hetero ring;
R1 to R5 are the same as or different from each other, and are each independently hydrogen, deuterium, a halogen group, a cyano group, a nitro group, a hydroxyl group, a carbonyl group, an ester group, an imide group, an amino group, a silyl group, a boron group, a substituted or unsubstituted alkyl group, a substituted or unsubstituted cycloalkyl group, a substituted or unsubstituted aryl group, or a substituted or unsubstituted heterocyclic group;

n1 and n2 are each an integer from 0 to 4;

n3 to n5 are each an integer from 0 to 3; and when n1 to n5 are each 2 or more, two or more substituents in the parenthesis are the same as or different from each other.

Further, the present invention provides an organic light emitting device including: a first electrode; a second electrode provided to face the first electrode; and an organic material layer having one or more layers provided between the first electrode and the second electrode, in which one or more layers of the organic material layer include the above-described compound.

Advantageous Effects

The compound described in the present specification can be used as a material for an organic material layer of an organic light emitting device. When an organic light emitting device including a compound according to at least one exemplary embodiment is manufactured, it is possible to obtain an organic light emitting device having excellent light emitting efficiency, a low driving voltage, high efficiency, and a long service life.

BRIEF DESCRIPTION OF DRAWINGS

FIG. 1 illustrates an example of an organic light emitting device composed of a substrate 1, a positive electrode 2, a light emitting layer 3, and a negative electrode 4.

FIG. 2 illustrates an example of an organic light emitting device composed of a substrate 1, a positive electrode 2, a hole injection layer 5, a hole transport layer 6, a light emitting layer 7, a layer 8 which simultaneously injects and transports electrons, and a negative electrode 4.

FIG. 3 illustrates a 1H-NMR measurement graph of Compound A.

FIG. 4 illustrates a 1H-NMR measurement graph of Compound B.

FIG. 5 illustrates a 1H-NMR measurement graph of Compound 1.

FIG. 6 illustrates a 1H-NMR measurement graph of Compound 5.

FIG. 7 illustrates a 1H-NMR measurement graph of Compound 6.

FIG. 8 illustrates a 1H-NMR measurement graph of Compound 7.

EXPLANATION OF REFERENCE NUMERALS AND SYMBOLS

1: Substrate
2: Positive electrode
3: Light emitting layer
4: Negative electrode
5: Hole injection layer
6: Hole transport layer
7: Light emitting layer
8: Layer which simultaneously injects and transports electrons

DETAILED DESCRIPTION

Hereinafter, the present specification will be described in more detail.

The present specification provides a compound of the following Formula 1. When the compound of the following Formula 1 is used for an organic material layer of an organic light emitting device, the efficiency and service life characteristics of the organic light emitting device are improved.

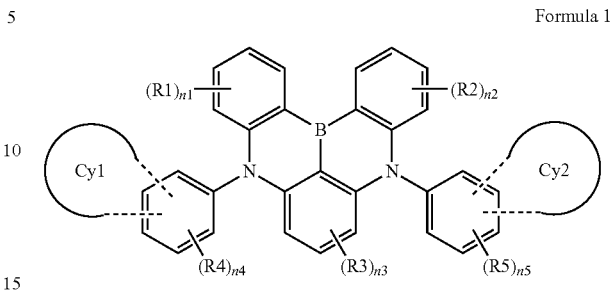

Formula 1

In Formula 1:

Cy1 and Cy2 are the same as or different from each other, and are each independently a substituted or unsubstituted hetero ring;

R1 to R5 are the same as or different from each other, and are each independently hydrogen, deuterium, a halogen group, a cyano group, a nitro group, a hydroxyl group, a carbonyl group, an ester group, an imide group, an amino group, a silyl group, a boron group, a substituted or unsubstituted alkyl group, a substituted or unsubstituted cycloalkyl group, a substituted or unsubstituted aryl group, or a substituted or unsubstituted heterocyclic group;

n1 and n2 are each an integer from 0 to 4;

n3 to n5 are each an integer from 0 to 3; and when n1 to n5 are each 2 or more, two or more substituents in the parenthesis are the same as or different from each other.

When one part "includes" one constituent element in the present specification, unless otherwise specifically described, this does not mean that another constituent element is excluded, but means that another constituent element can be further included.

When one member is disposed "on" another member in the present specification, this includes not only a case where the one member is brought into contact with another member, but also a case where still another member is present between the two members.

Examples of the substituents in the present specification will be described below, but are not limited thereto.

The term "substitution" means that a hydrogen atom bonded to a carbon atom of a compound is changed into another substituent, and a position to be substituted is not limited as long as the position is a position at which the hydrogen atom is substituted, that is, a position at which the substituent can be substituted, and when two or more are substituted, the two or more substituents can be the same as or different from each other.

In the present specification, the term "substituted or unsubstituted" means being substituted with one or two or more substituents selected from the group consisting of deuterium, a halogen group, a cyano group (—CN), a nitro group, a hydroxyl group, a carbonyl group, an ester group, an imide group, an amino group, a silyl group, a boron group, a substituted or unsubstituted alkyl group, a substituted or unsubstituted cycloalkyl group, a substituted or unsubstituted aryl group, and a substituted or unsubstituted heterocyclic group or being substituted with a substituent to which two or more substituents are linked among the substituents exemplified above, or having no substituent. For example, "the substituent to which two or more substituents are linked" can be a biphenyl group. That is, the biphenyl group can also be an aryl group, and can also be interpreted as a substituent to which two phenyl groups are linked.

Examples of the substituents will be described below, but are not limited thereto.

In the present specification, examples of a halogen group include fluorine (—F), chlorine (—Cl), bromine (—Br) or iodine (—I).

In the present specification, the number of carbon atoms of a carbonyl group is not particularly limited, but is preferably 1 to 40. Specifically, the carbonyl group can be a compound having the following structures, but is not limited thereto:

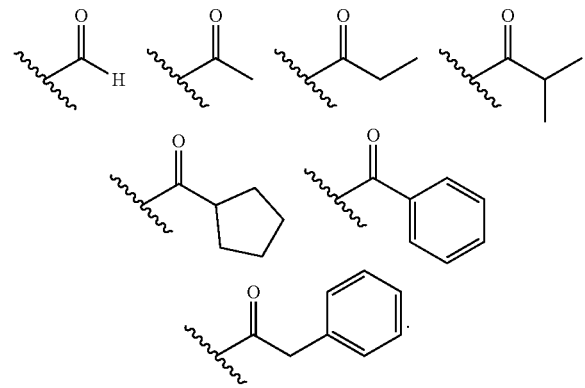

In the present specification, for an ester group, the oxygen of the ester group can be substituted with a straight-chained, branched, or cyclic alkyl group having 1 to 20 carbon atoms, or an aryl group having 6 to 30 carbon atoms. Specifically, the ester group can be a compound having the following structural formulae, but is not limited thereto:

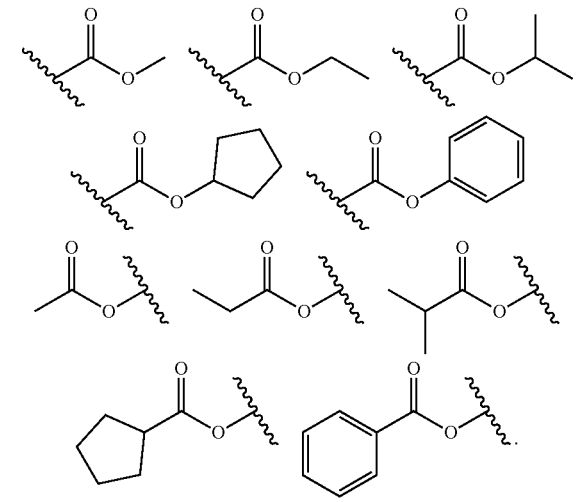

In the present specification, the number of carbon atoms of an imide group is not particularly limited, but is preferably 1 to 25. Specifically, the imide group can be a compound having the following structures, but is not limited thereto:

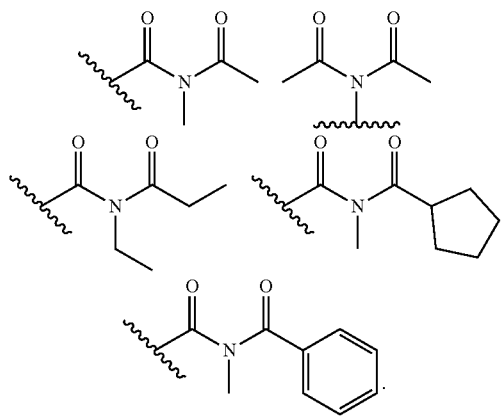

In the present specification, a silyl group can be —Si-$Y_aY_bY_c$, and $Y_a$, $Y_b$, and $Y_c$ can be each hydrogen, a substituted or unsubstituted alkyl group, or a substituted or unsubstituted aryl group. Specific examples of the silyl group include a trimethylsilyl group, a triethylsilyl group, a tert-butyldimethylsilyl group, a vinyldimethyl-silyl group, a propyldimethylsilyl group, a triphenyl-silyl group, a diphenylsilyl group, a phenylsilyl group, and the like, but are not limited thereto.

In the present specification, a boron group can be —$BY_dY_e$, and $Y_d$ and $Y_e$ can be each hydrogen, a substituted or unsubstituted alkyl group, or a substituted or unsubstituted aryl group. Specific examples of the boron group include a trimethylboron group, a triethylboron group, a tert-butyldimethylboron group, a triphenylboron group, a phenylboron group, and the like, but are not limited thereto.

In the present specification, the alkyl group can be straight-chained or branched, and the number of carbon atoms thereof is not particularly limited, but is preferably 1 to 60. According to an exemplary embodiment, the number of carbon atoms of the alkyl group is 1 to 30. According to another exemplary embodiment, the number of carbon atoms of the alkyl group is 1 to 20. According to still another exemplary embodiment, the number of carbon atoms of the alkyl group is 1 to 10. Specific examples of the alkyl group include a methyl group, an ethyl group, a propyl group, an n-propyl group, an isopropyl group, a butyl group, an n-butyl group, an isobutyl group, a tert-butyl group, a pentyl group, an n-pentyl group, a hexyl group, an n-hexyl group, a heptyl group, an n-heptyl group, an octyl group, an n-octyl group, and the like, but are not limited thereto.

In the present specification, a cycloalkyl group is not particularly limited, but has preferably 3 to 60 carbon atoms, and according to an exemplary embodiment, the number of carbon atoms of the cycloalkyl group is 3 to 30. According to another exemplary embodiment, the number of carbon atoms of the cycloalkyl group is 3 to 20. According to still another exemplary embodiment, the number of carbon atoms of the cycloalkyl group is 3 to 6. Specific examples thereof include a cyclopropyl group, a cyclobutyl group, a cyclopentyl group, a cyclohexyl group, a cycloheptyl group, a cyclooctyl group, and the like, but are not limited thereto.

In the present specification, an aryl group is not particularly limited, but has preferably 6 to 60 carbon atoms, and can be a monocyclic aryl group or a polycyclic aryl group. According to an exemplary embodiment, the number of carbon atoms of the aryl group is 6 to 30. According to an exemplary embodiment, the number of carbon atoms of the aryl group is 6 to 20. Examples of the monocyclic aryl group include a phenyl group, a biphenyl group, a terphenyl group, a quarterphenyl group, and the like, but are not limited thereto. Examples of the polycyclic aryl group include a naphthyl group, an anthracenyl group, a phenanthrenyl group, a pyrenyl group, a perylenyl group, a triphenyl group, a chrysenyl group, a fluorenyl group, a triphenylenyl group, and the like, but are not limited thereto.

In the present specification, a fluorenyl group can be substituted, and two substituents can be bonded to each other to form a spiro structure.

When the fluorenyl group is substituted, the fluorenyl group can be a substituted fluorenyl group such as a spiro fluorenyl group such as

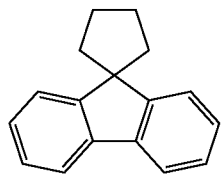 [SMILES: c1ccc2c(c1)-c1ccccc1C21CCCC1]

and

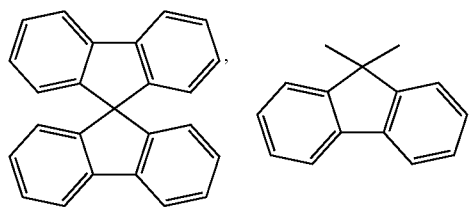

(a 9,9-dimethylfluorenyl group), and

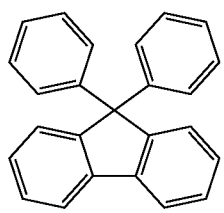 [SMILES: c1ccc(C2(c3ccccc3)c3ccccc3-c3ccccc32)cc1]

(a 9,9-diphenylfluorenyl group). However, the fluorenyl group is not limited thereto.

In the present specification, a heterocyclic group is a ring group including one or more of N, O, P, S, Si, and Se as a heteroatom, and the number of carbon atoms thereof is not particularly limited, but is preferably 2 to 60. According to an exemplary embodiment, the number of carbon atoms of the heterocyclic group is 2 to 30. Examples of the heterocyclic group include a pyridine group, a pyrrole group, a pyrimidine group, a quinoline group, a pyridazinyl group, a furan group, a thiophene group, an imidazole group, a pyrazole group, a dibenzofuran group, a dibenzothiophene group, a carbazole group, a benzocarbazole group, a naphthobenzofuran group, a benzonaphthothiophene group, an indenocarbazole group, and the like, but are not limited thereto.

In the present specification, the above-described description on the heterocyclic group can be applied to a heteroaryl group except for an aromatic group.

In the present specification, the above-described description on the aryl group can be applied to an arylene group except for a divalent arylene group.

In the present specification, the above-described description on the heteroaryl group can be applied to a heteroarylene group except for a divalent heteroarylene group.

According to an exemplary embodiment of the present invention, Cy1 and Cy2 are the same as or different from each other, and are each independently a substituted or unsubstituted hetero ring.

In an exemplary embodiment of the present invention, Cy1 and Cy2 are the same as or different from each other, and are each independently a substituted or unsubstituted hetero ring including one or more of O, S, and N as a heteroelement.

According to an exemplary embodiment of the present invention, Cy1 and Cy2 are the same as or different from each other, and are each independently a substituted or unsubstituted bicyclic hetero ring.

In another exemplary embodiment, Cy1 and Cy2 are the same as or different from each other, and are each independently a substituted or unsubstituted bicyclic hetero ring having 2 to 60 carbon atoms.

According to another exemplary embodiment, Cy1 and Cy2 are the same as or different from each other, and are each independently a substituted or unsubstituted bicyclic hetero ring having 2 to 60 carbon atoms, including one or more of O, S, and N as a heteroelement.

According to an exemplary embodiment of the present invention, Cy1 and Cy2 are the same as or different from each other, and are each independently a hetero ring.

According to another exemplary embodiment, Cy1 and Cy2 are the same as or different from each other, and are each independently a substituted or unsubstituted hetero ring having 2 to 60 carbon atoms.

In still another exemplary embodiment, Cy1 and Cy2 are the same as or different from each other, and are each independently a hetero ring having 2 to 60 carbon atoms.

According to yet another exemplary embodiment, Cy1 and Cy2 are the same as or different from each other, and are each independently a substituted or unsubstituted hetero ring having 2 to 30 carbon atoms.

In still yet another exemplary embodiment, Cy1 and Cy2 are the same as or different from each other, and are each independently a hetero ring having 2 to 30 carbon atoms.

According to a further exemplary embodiment, Cy1 and Cy2 are the same as or different from each other, and are each independently a substituted or unsubstituted 2,3-dihydrobenzofuran, a substituted or unsubstituted benzofuran, a substituted or unsubstituted 2,3-dihydrobenzohiophene, or a substituted or unsubstituted benzothiophene.

In another further exemplary embodiment, Cy1 and Cy2 are the same as or different from each other, and are each independently 2,3-dihydrobenzofuran, benzofuran, 2,3-dihydrobenzothiophene, or benzothiophene.

In an exemplary embodiment of the present specification, Formula 1 is any one of the following Formula 1-a or 1-b:

Formula 1-a

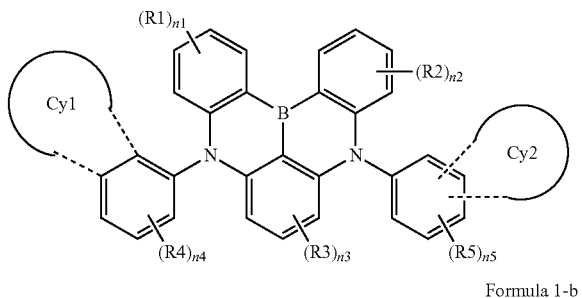

Formula 1-b

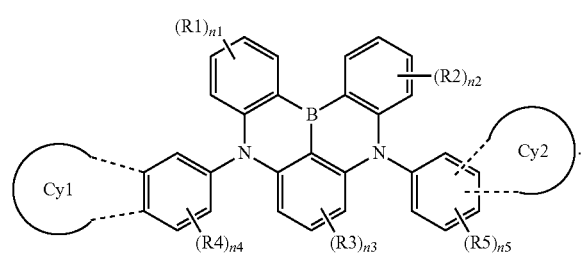

In Formulae 1-a and 1-b:

the definitions of Cy1, Cy2, R1 to R5, and n1 to n5 are the same as those in Formula 1.

According to another exemplary embodiment, Formula 1 is any one of the following Formulae 2 to 4:

Formula 2

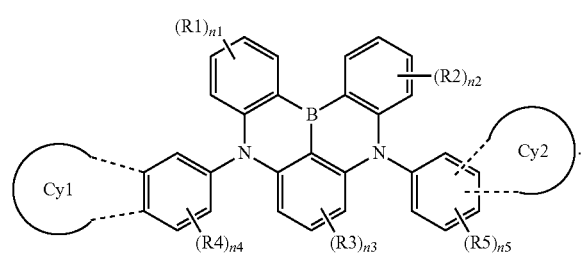

Formula 3

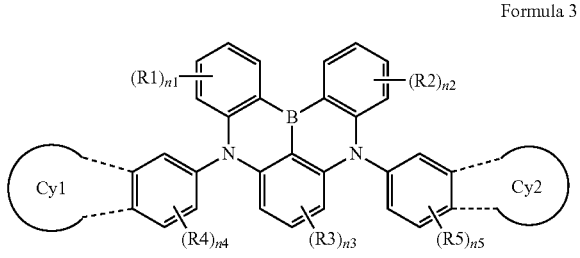

Formula 4

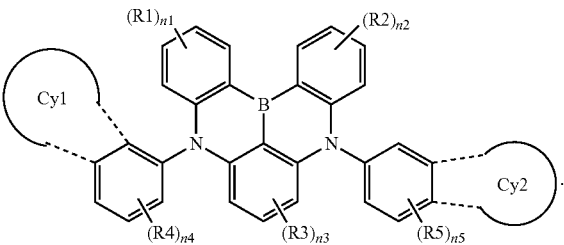

In Formulae 2 to 4:

the definitions of Cy1, Cy2, R1 to R5, and n1 to n5 are the same as those in Formula 1.

According to an exemplary embodiment of the present invention, Formula 1 is the following Formula 1-1:

Formula 1-1

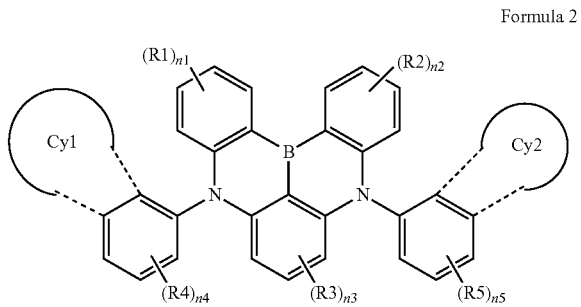

In Formula 1-1:

the definitions of Cy1 and Cy2 are the same as those in Formula 1.

In an exemplary embodiment of the present specification, Formula 1 is any one of the following Formulae 5 to 12:

Formula 5

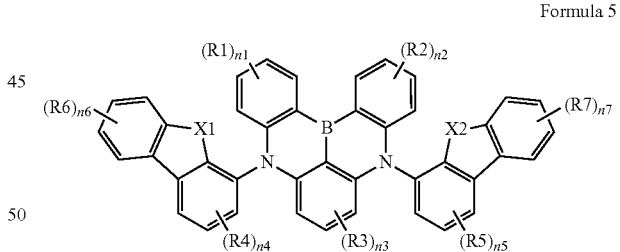

Formula 6

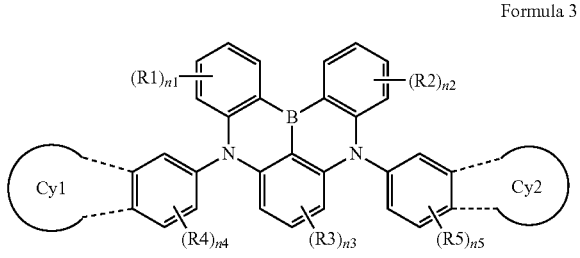

Formula 7

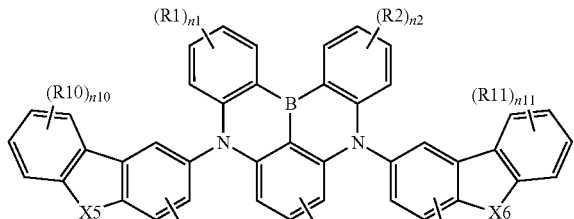

Formula 8

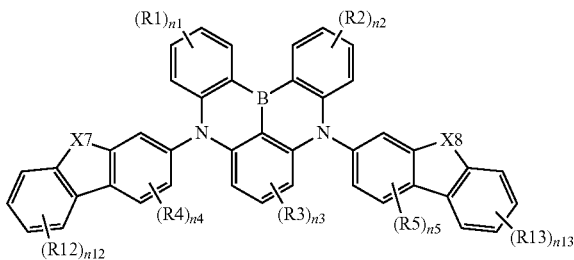

Formula 9

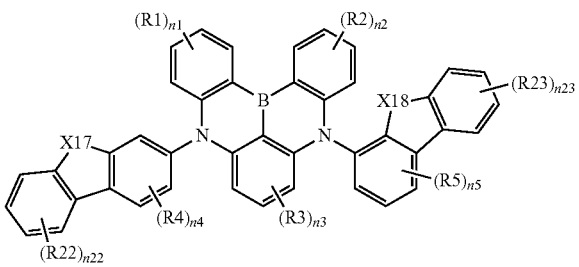

Formula 10

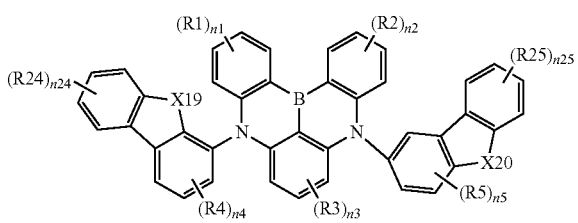

Formula 11

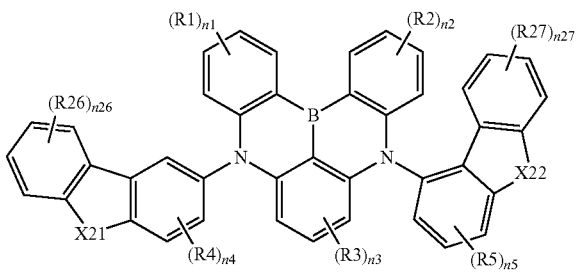

Formula 12

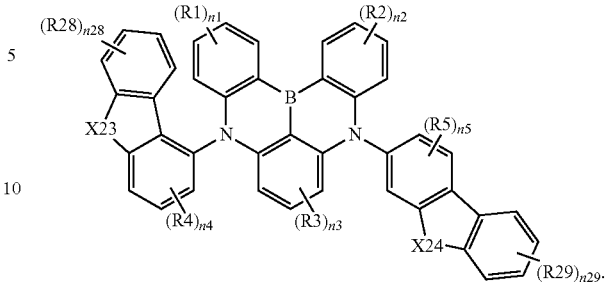

In Formulae 5 to 12:
the definitions of R1 to R5 and n1 to n5 are the same as those in Formula 1;
X1 to X8 and X17 to X24 are the same as or different from each other, and are each independently O, S, or NR;
R, R6 to R13, and R22 to R29 are the same as or different from each other, and are each independently hydrogen, deuterium, a halogen group, a cyano group, a nitro group, a hydroxyl group, a carbonyl group, an ester group, an imide group, an amino group, a silyl group, a boron group, a substituted or unsubstituted alkyl group, a substituted or unsubstituted cycloalkyl group, a substituted or unsubstituted aryl group, or a substituted or unsubstituted heterocyclic group; and
n6 to n13 and n22 to n29 are each an integer from 0 to 4, and when n6 to n13 and n22 to n29 are each 2 or more, two or more substituents in the parenthesis are the same as or different from each other.

According to an exemplary embodiment of the present invention, X1 to X8 and X17 to X24 are the same as or different from each other, and are each independently O or S.

According to another exemplary embodiment, X1 to X8 and X17 to X24 are each O.

According to still another exemplary embodiment, X1 to X8 and X17 to X24 are each S.

In an exemplary embodiment of the present invention, R1 to R5 are the same as or different from each other, and are each independently hydrogen, or a substituted or unsubstituted aryl group having 6 to 60 carbon atoms.

In another exemplary embodiment, R1 to R5 are the same as or different from each other, and are each independently hydrogen, or a substituted or unsubstituted aryl group having 6 to 30 carbon atoms.

According to still another exemplary embodiment, R1 to R5 are the same as or different from each other, and are each independently hydrogen, a phenyl group, a biphenyl group, or a naphthyl group.

In yet another exemplary embodiment, n1 to n5 are each an integer from 0 to 2.

According to still yet another exemplary embodiment, n1 to n5 are each 0 or 1.

According to an exemplary embodiment of the present invention, R, R6 to R13, and R22 to R29 are the same as or different from each other, and are each independently hydrogen, or a substituted or unsubstituted aryl group having 6 to 60 carbon atoms.

According to another exemplary embodiment, R, R6 to R13, and R22 to R29 are the same as or different from each other, and are each independently hydrogen, or a substituted or unsubstituted aryl group having 6 to 30 carbon atoms.

In still another exemplary embodiment, R is a phenyl group, a biphenyl group, or a naphthyl group.

According to yet another exemplary embodiment, R6 to R13 and R22 to R29 are hydrogen.

In still yet another exemplary embodiment, n6 to n13 and n22 to n29 are each an integer from 0 to 2, and when n6 to n13 and n22 to n29 are each 2, two substituents in the parenthesis are the same as or different from each other.

According to a further exemplary embodiment, n6 to n13 and n22 to n29 are each 0 or 1.

According to an exemplary embodiment of the present invention, the compound of Formula 1 can be any one of the following compounds:

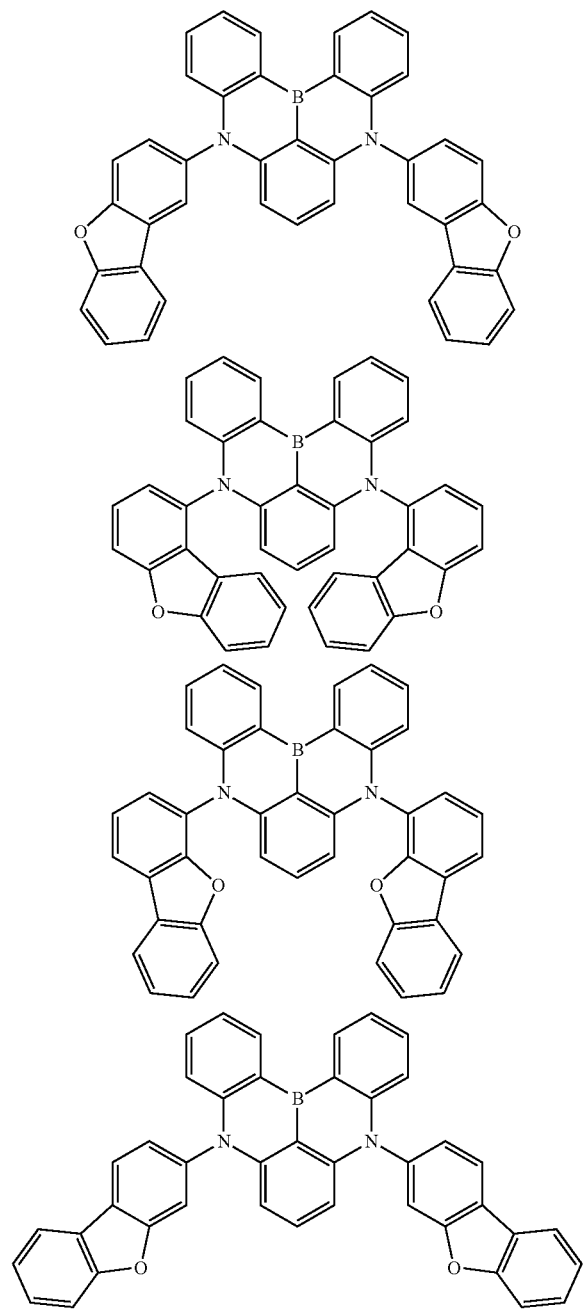

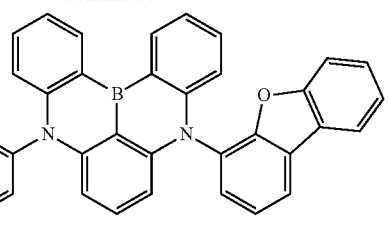

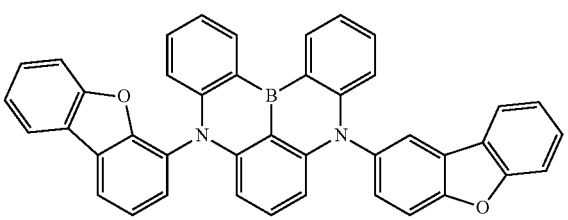

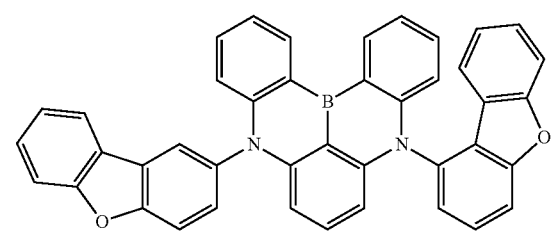

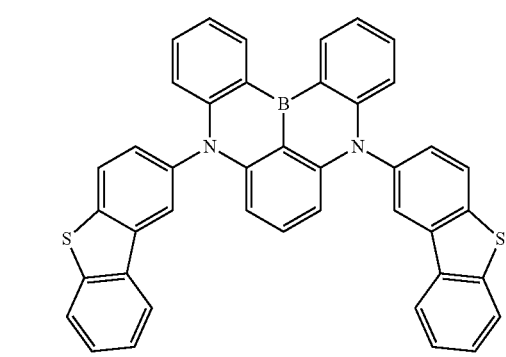

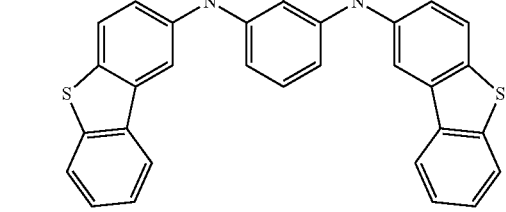

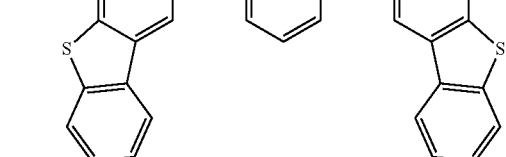

-continued
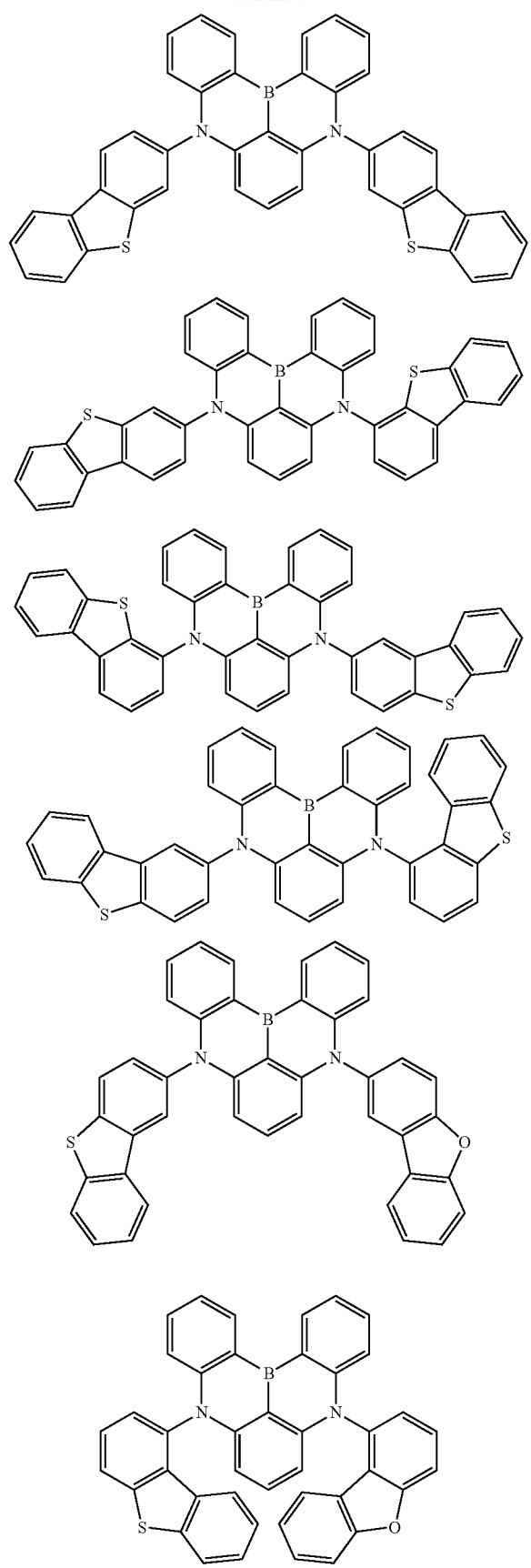
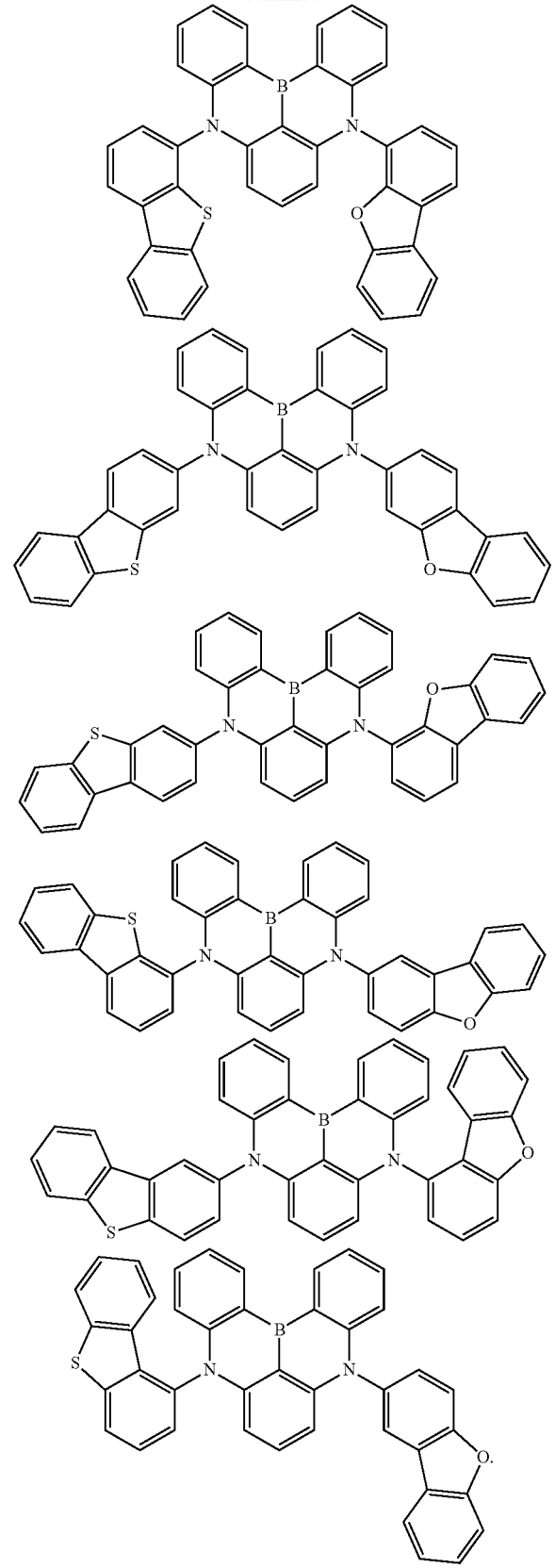
According to an exemplary embodiment of the present invention, the compound of Formula 1 can be prepared by a method for preparing a compound to be described below. The substituent can be bonded by a method known in the art, and the type and position of the substituent and the number of substituents can be changed according to the technology known in the art.

In the present invention, various substituents can be introduced into the core structure of Formula 1 to synthesize compounds having various energy bandgaps. Further, in the present invention, various substituents can also be introduced into the core structure having the structure described above to adjust the HOMO and LUMO energy levels of compounds.

In addition, various substituents can be introduced into the core structure having the structure described above to synthesize compounds having inherent characteristics of the introduced substituents. For example, a substituent mainly used for a material for a hole injection layer, a material for transporting holes, a material for blocking electrons, a material for a light emitting layer, and a material for an electron transport layer, which are used at the time of manufacturing an organic light emitting device, can be introduced into the core structure to synthesize a material which satisfies conditions required for each organic material layer.

Further, the organic light emitting device according to the present invention is an organic light emitting device including: a first electrode; a second electrode provided to face the first electrode; and an organic material layer having one or more layers provided between the first electrode and the second electrode, in which one or more layers of the organic material layer include the above-described compound of Formula 1.

The organic light emitting device of the present invention can be manufactured by typical preparation methods and materials of an organic light emitting device, except that the above-described compound is used to form an organic material layer having one or more layers.

The compound can be formed as an organic material layer by not only a vacuum deposition method, but also a solution application method when an organic light emitting device is manufactured. Here, the solution application method means spin coating, dip coating, inkjet printing, screen printing, a spray method, roll coating, and the like, but is not limited thereto.

The organic material layer of the organic light emitting device of the present invention can also be composed of a single-layered structure, but can be composed of a multi-layered structure in which two or more organic material layers are stacked. For example, the organic light emitting device of the present invention can have a structure including a hole injection layer, a hole transport layer, a layer which simultaneously transports and injects holes, an electron blocking layer, a light emitting layer, an electron transport layer, an electron injection layer, a layer which simultaneously transports and injects electrons, and the like as an organic material layer. However, the structure of the organic light emitting device is not limited thereto, and can include a fewer or greater number of organic material layers.

In the organic light emitting device of the present invention, the organic material layer can include an electron transport layer or an electron injection layer, and the electron transport layer or the electron injection layer can include the above-described compound.

In the organic light emitting device of the present invention, the organic material layer can include a hole injection layer or a hole transport layer, and the hole injection layer or the hole transport layer can include the above-described compound.

In the organic light emitting device of the present invention, the organic material layer includes a light emitting layer, and the light emitting layer includes the above-described compound.

According to another exemplary embodiment, the organic material layer includes a light emitting layer, and the light emitting layer can include the above-described compound as a dopant of the light emitting layer.

In still another exemplary embodiment, the organic material layer includes a light emitting layer, and the light emitting layer includes the above-described compound as a dopant of the light emitting layer, and can further include a host.

According to an exemplary embodiment of the present invention, the organic material layer includes a light emitting layer, and the light emitting layer includes the above-described compound as a dopant of the light emitting layer, and can further include a compound of the following Formula 1-A as a host:

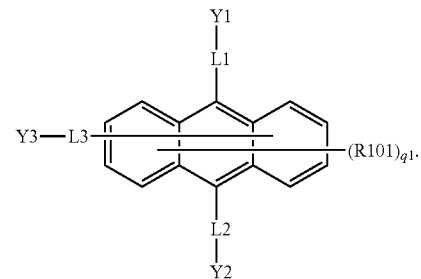

Formula 1-A

In Formula 1-A:
  Y1 to Y3 are the same as or different from each other, and are each independently hydrogen, a substituted or unsubstituted aryl group, or a substituted or unsubstituted heterocyclic group;
  L1 to L3 are the same as or different from each other, and are each independently a direct bond, a substituted or unsubstituted arylene group, or a substituted or unsubstituted heteroarylene group;
  R101 is hydrogen, deuterium, a halogen group, a cyano group, a nitro group, a silyl group, a substituted or unsubstituted alkyl group, a substituted or unsubstituted cycloalkyl group, a substituted or unsubstituted phosphine oxide group, a substituted or unsubstituted aryl group, or a substituted or unsubstituted heterocyclic group; and
  q1 is an integer from 0 to 7, and when q1 is 2 or more, two or more R101s are the same as or different from each other.

According to an exemplary embodiment of the present invention, Y1 to Y3 are the same as or different from each other, and are each independently hydrogen, a substituted or unsubstituted aryl group, or a substituted or unsubstituted heterocyclic group.

According to another exemplary embodiment, Y1 to Y3 are the same as or different from each other, and are each independently hydrogen, a substituted or unsubstituted aryl group having 6 to 60 carbon atoms, or a substituted or unsubstituted heterocyclic group having 2 to 60 carbon atoms.

In still another exemplary embodiment, Y1 to Y3 are the same as or different from each other, and are each independently hydrogen, a substituted or unsubstituted aryl group having 6 to 30 carbon atoms, or a substituted or unsubstituted heterocyclic group having 2 to 30 carbon atoms.

According to yet another exemplary embodiment, Y3 is hydrogen.

In still yet another exemplary embodiment, Y1 is hydrogen, a substituted or unsubstituted phenyl group, a substituted or unsubstituted naphthyl group, a substituted or unsubstituted dibenzofuran group, a substituted or unsubstituted naphthobenzofuran group, a substituted or unsubstituted thiophene group, or a substituted or unsubstituted indolocarbazole group.

According to a further exemplary embodiment, Y1 is hydrogen; a phenyl group which is unsubstituted or substituted with deuterium, an alkyl group having 1 to 10 carbon atoms or an aryl group having 6 to 30 carbon atoms; a naphthyl group which is unsubstituted or substituted with deuterium, an alkyl group having 1 to 10 carbon atoms or an aryl group having 6 to 30 carbon atoms; a dibenzofuran group which is unsubstituted or substituted with deuterium, an alkyl group having 1 to 10 carbon atoms or an aryl group having 6 to 30 carbon atoms; a naphthobenzofuran group which is unsubstituted or substituted with deuterium, an alkyl group having 1 to 10 carbon atoms or an aryl group having 6 to 30 carbon atoms; a thiophene group which is unsubstituted or substituted with deuterium, an alkyl group having 1 to 10 carbon atoms or an aryl group having 6 to 30 carbon atoms; or an indolocarbazole group which is unsubstituted or substituted with deuterium, an alkyl group having 1 to 10 carbon atoms or an aryl group having 6 to 30 carbon atoms.

In another further exemplary embodiment, Y1 is hydrogen; a phenyl group which is unsubstituted or substituted with deuterium; a naphthyl group which is unsubstituted or substituted with a methyl group; a dibenzofuran group; a naphthobenzofuran group; a thiophene group which is substituted with a phenyl group; or an indolocarbazole group.

According to an exemplary embodiment of the present invention, Y2 is hydrogen, or a substituted or unsubstituted aryl group having 6 to 30 carbon atoms.

According to another exemplary embodiment, Y2 is hydrogen, a substituted or unsubstituted phenyl group, a substituted or unsubstituted biphenyl group, or a substituted or unsubstituted naphthyl group.

In still another exemplary embodiment, Y2 is hydrogen; a phenyl group which is unsubstituted or substituted with deuterium (D), a halogen group, a cyano group, a silyl group, an alkyl group having 1 to 10 carbon atoms, a cycloalkyl group having 3 to 30 carbon atoms, or an aryl group having 6 to 30 carbon atoms; a biphenyl group which is unsubstituted or substituted with deuterium (D), a halogen group, a cyano group, a silyl group, an alkyl group having 1 to 10 carbon atoms, a cycloalkyl group having 3 to 30 carbon atoms, or an aryl group having 6 to 30 carbon atoms; or a naphthyl group which is unsubstituted or substituted with deuterium (D), a halogen group, a cyano group, a silyl group, an alkyl group having 1 to 10 carbon atoms, a cycloalkyl group having 3 to 30 carbon atoms, or an aryl group having 6 to 30 carbon atoms.

According to still yet another exemplary embodiment, Y2 is hydrogen; a phenyl group which is unsubstituted or substituted with a cyclohexyl group, a phenyl group, or a naphthyl group; a biphenyl group which is unsubstituted or substituted with deuterium, fluorine, a cyano group, or a trimethylsilyl group; or a naphthyl group which is unsubstituted or substituted with a methyl group, a phenyl group, or a naphthyl group.

According to an exemplary embodiment of the present specification, L1 to L3 are the same as or different from each other, and are each independently a direct bond, a substituted or unsubstituted arylene group, or a substituted or unsubstituted heteroarylene group.

In another exemplary embodiment, L1 to L3 are the same as or different from each other, and are each independently a direct bond, a substituted or unsubstituted arylene group having 6 to 60 carbon atoms, or a substituted or unsubstituted heteroarylene group having 2 to 60 carbon atoms.

According to still another exemplary embodiment, L1 to L3 are the same as or different from each other, and are each independently a direct bond, a substituted or unsubstituted arylene group having 6 to 30 carbon atoms, or a substituted or unsubstituted heteroarylene group having 2 to 30 carbon atoms.

According to yet another exemplary embodiment, L1 to L3 are the same as or different from each other, and are each independently a direct bond, or a substituted or unsubstituted arylene group having 6 to 30 carbon atoms.

In still yet another exemplary embodiment, L1 to L3 are the same as or different from each other, and are each independently a direct bond, a substituted or unsubstituted phenylene group, or a substituted or unsubstituted naphthylene group.

According to a further exemplary embodiment, L1 to L3 are the same as or different from each other, and are each independently a direct bond, a phenylene group, or a naphthylene group.

According to an exemplary embodiment of the present invention, R101 is hydrogen, deuterium, a halogen group, a cyano group (—CN), a nitro group, a silyl group, a substituted or unsubstituted alkyl group, a substituted or unsubstituted cycloalkyl group, a substituted or unsubstituted phosphine oxide group, a substituted or unsubstituted aryl group, or a substituted or unsubstituted heterocyclic group.

According to another exemplary embodiment, R101 is hydrogen, deuterium, a halogen group, a cyano group (—CN), a nitro group, a silyl group, a substituted or unsubstituted alkyl group having 1 to 20 carbon atoms, a substituted or unsubstituted cycloalkyl group having 3 to 30 carbon atoms, a substituted or unsubstituted phosphine oxide group, a substituted or unsubstituted aryl group having 6 to 30 carbon atoms, or a substituted or unsubstituted heterocyclic group having 2 to 30 carbon atoms.

In still another exemplary embodiment, R101 is hydrogen.

According to an exemplary embodiment of the present invention, q1 is an integer from 0 to 2.

In another exemplary embodiment, q1 is 0 or 1.

In an exemplary embodiment of the present specification, a compound of Formula 1-A can be any one of the following compounds:

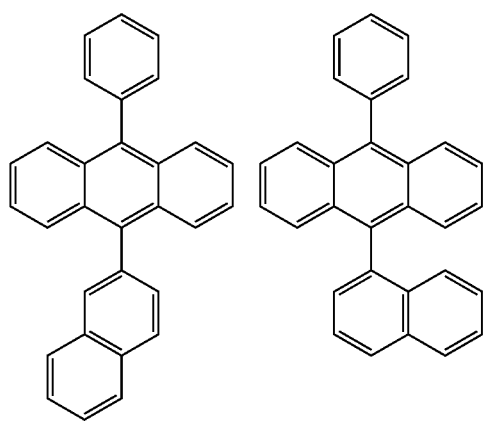
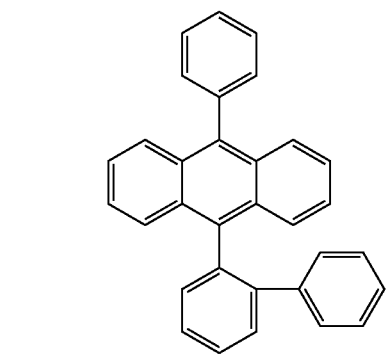
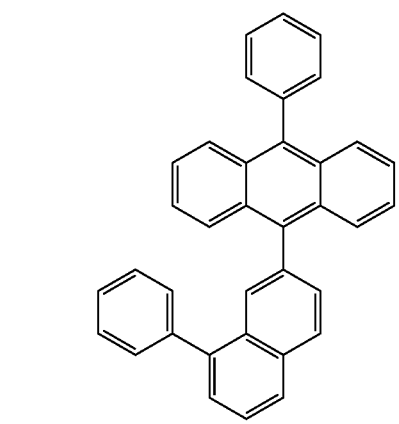
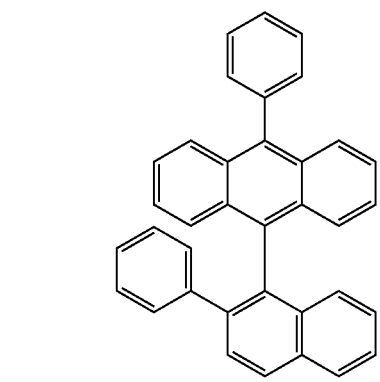
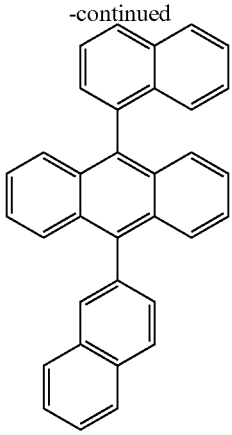
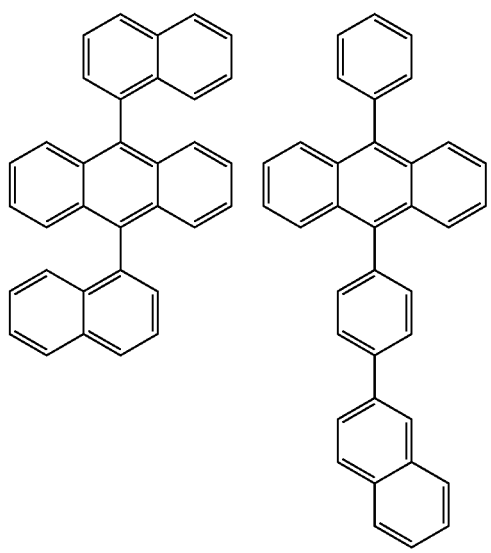
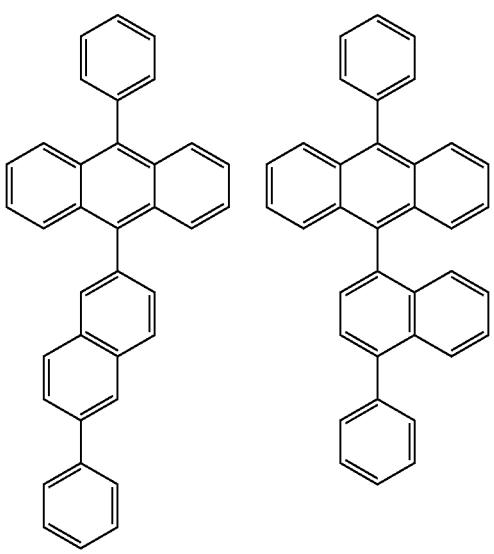

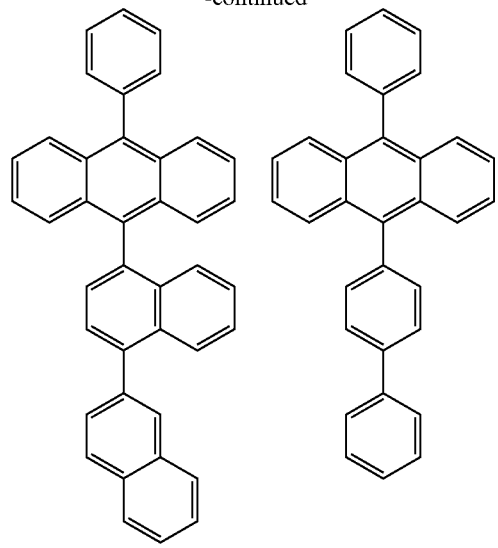
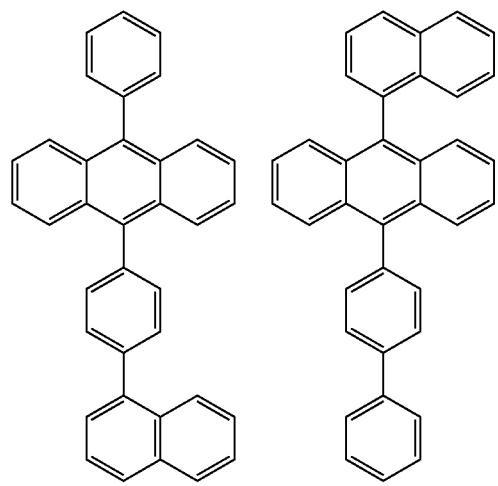
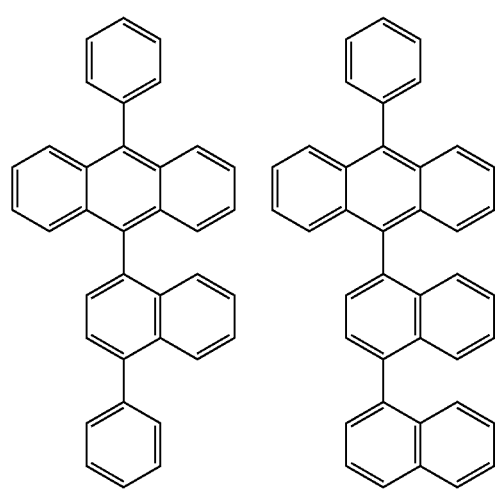
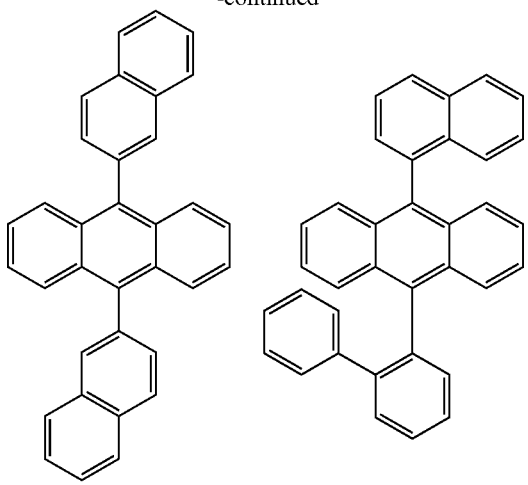
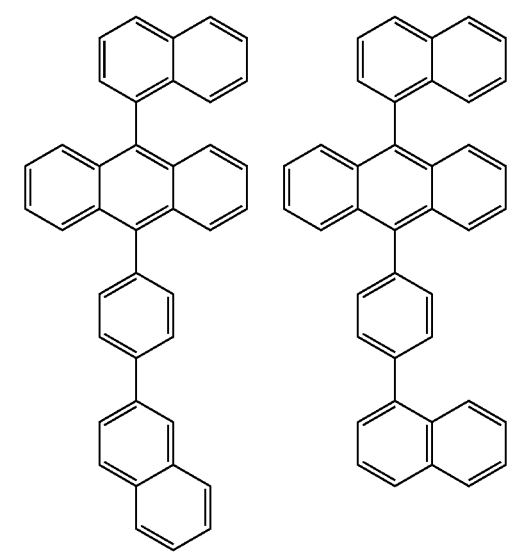
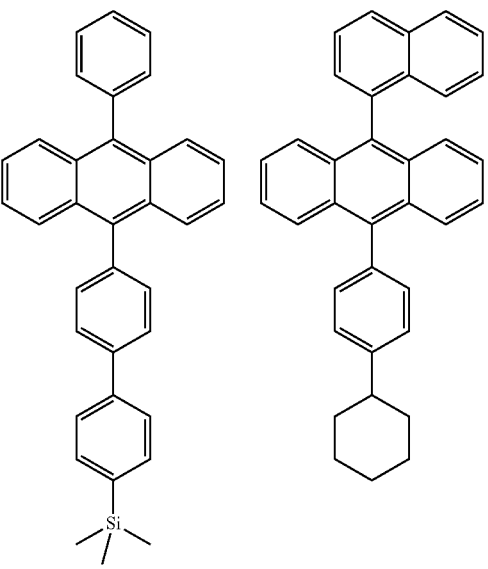

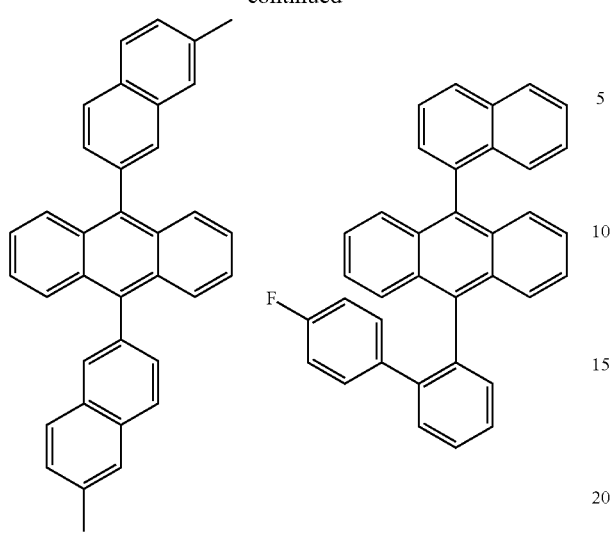
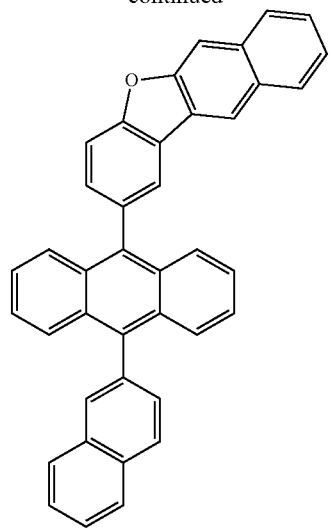
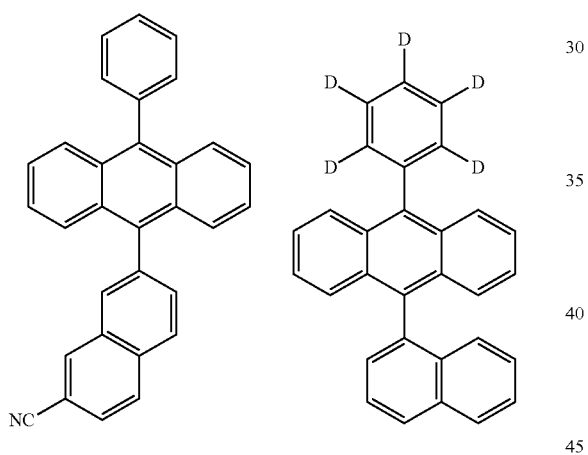
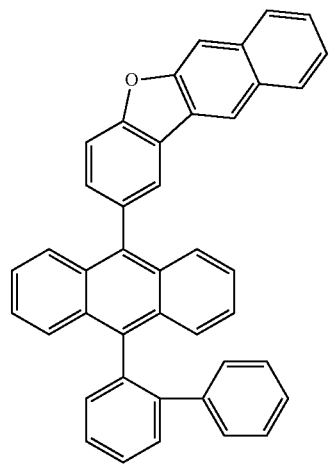
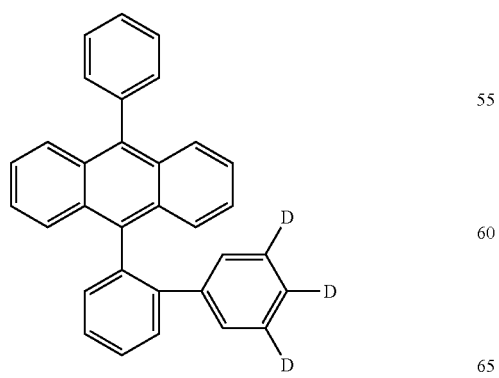
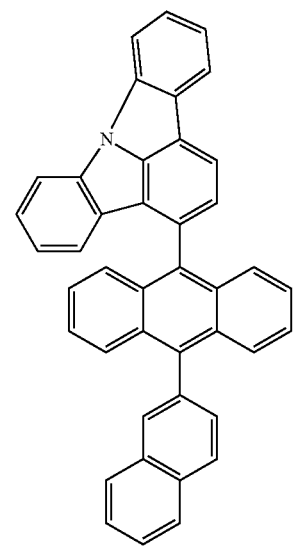

27
-continued
28
-continued
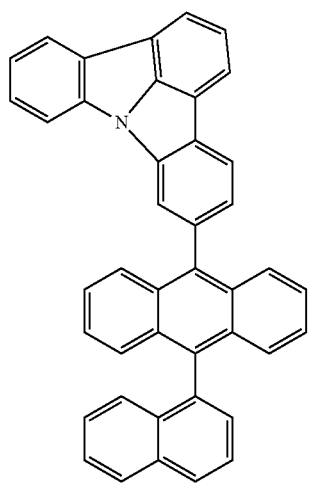
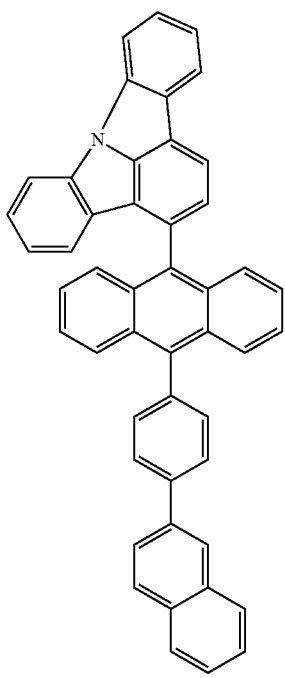
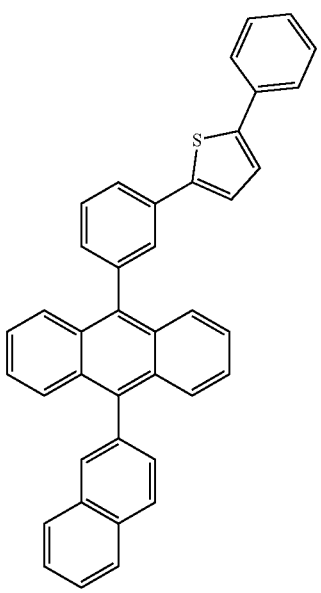

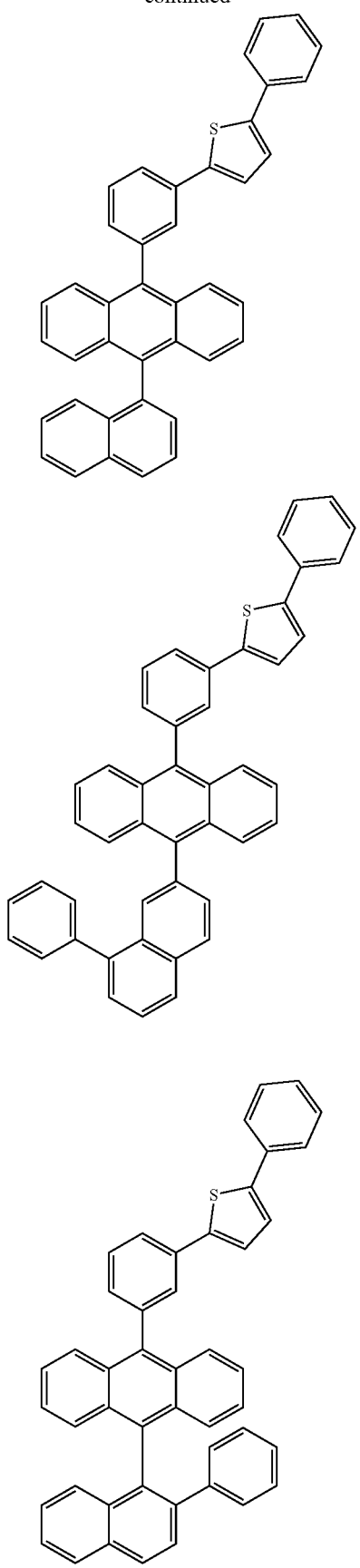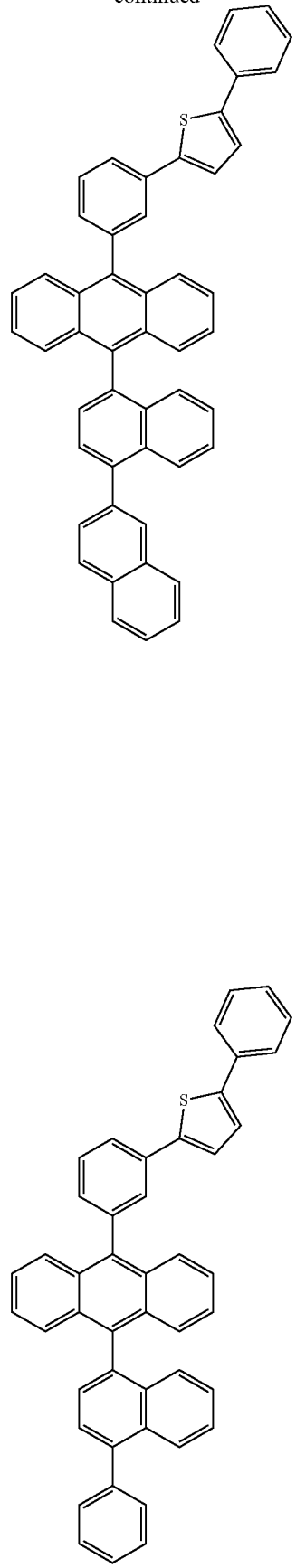

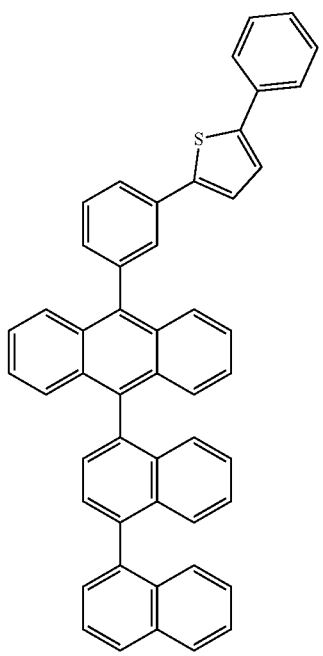
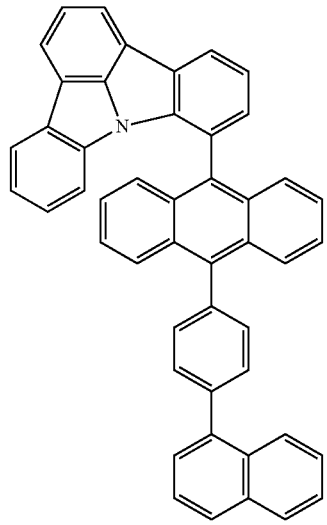
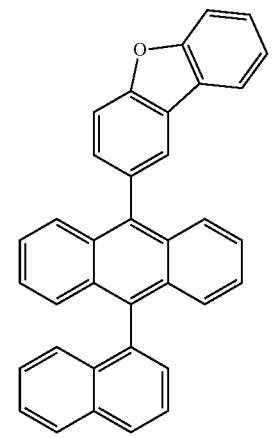
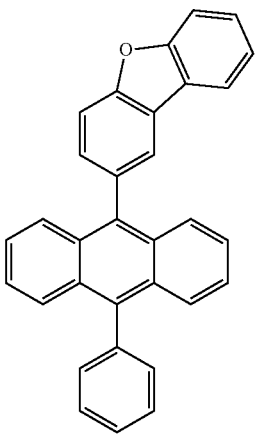
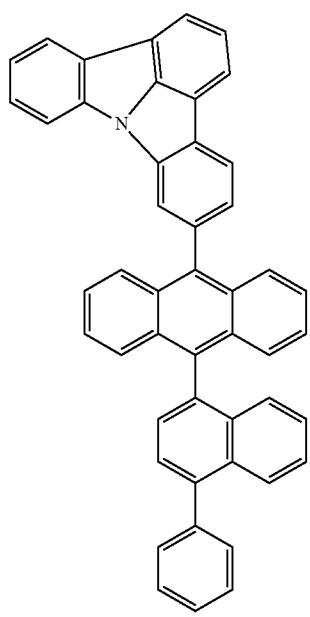
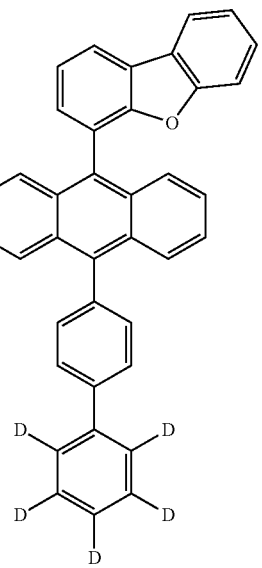

-continued
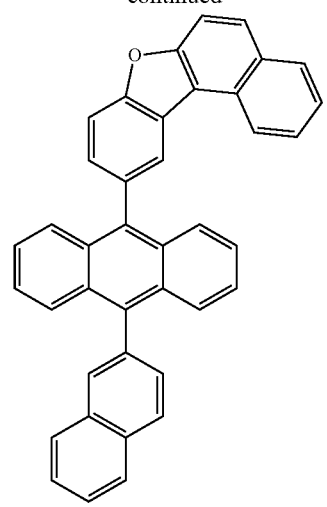
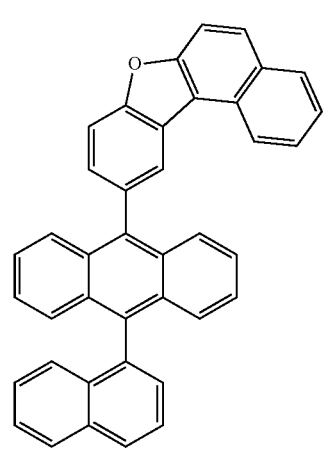
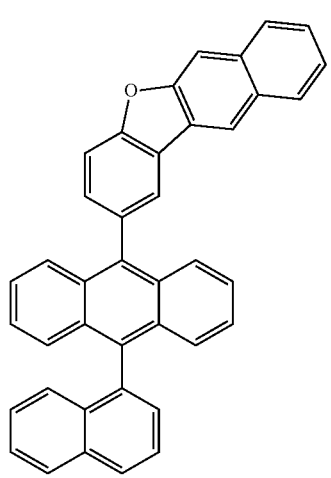
-continued
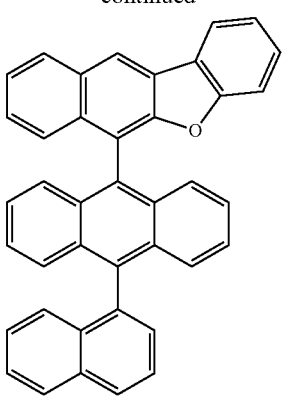
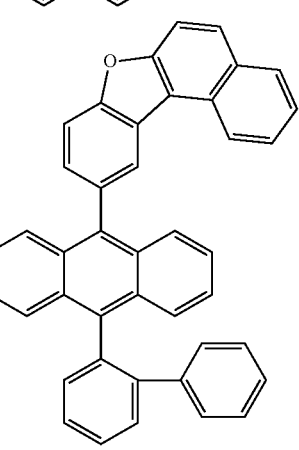
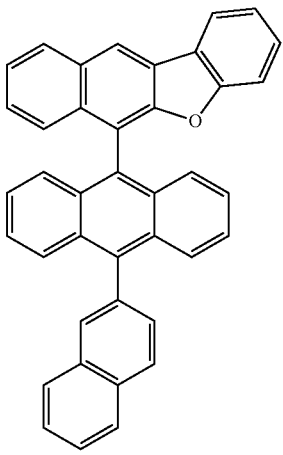
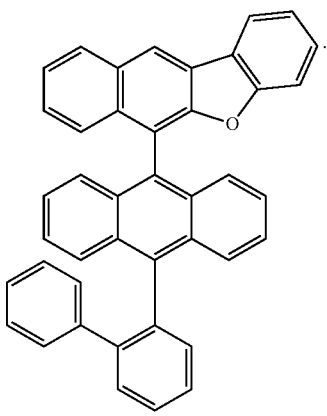 [SMILES: c1ccc(-c2ccccc2-c2c3ccccc3c(-c3c4ccccc4cc4c3oc3ccccc34)c3ccccc23)cc1]

In an exemplary embodiment of the present invention, the organic material layer includes a light emitting layer, the light emitting layer includes the above-described compound as a dopant of the light emitting layer, and when Formula 1-A is included as a host, the content of the dopant can be 1 part by weight to 10 parts by weight based on 100 parts by weight of the host.

According to another exemplary embodiment, the organic material layer includes a light emitting layer, and the light emitting layer includes the above-described compound as a dopant of the light emitting layer, and can further include two or more of compounds of the following Formula 1-B and Formula 1-C as a host:

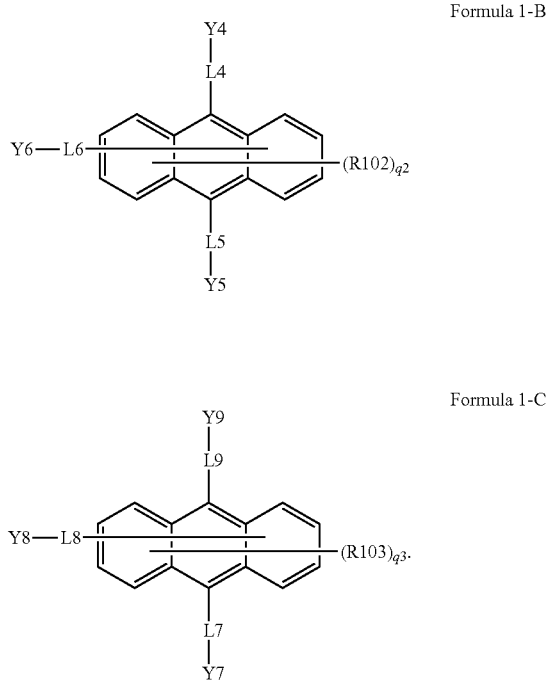

In Formulae 1-B and 1-C:

Y4 to Y8 are the same as or different from each other, and are each independently hydrogen, or a substituted or unsubstituted aryl group;

Y9 is a substituted or unsubstituted heterocyclic group;

L4 to L9 are the same as or different from each other, and are each independently a direct bond, a substituted or unsubstituted arylene group, or a substituted or unsubstituted heteroarylene group;

R102 and R103 are the same as or different from each other, and are each independently hydrogen, deuterium, a halogen group, a cyano group, a nitro group, a silyl group, a substituted or unsubstituted alkyl group, a substituted or unsubstituted cycloalkyl group, a substituted or unsubstituted phosphine oxide group, a substituted or unsubstituted aryl group, or a substituted or unsubstituted heterocyclic group; and q2 and q3 are each an integer from 0 to 7, and when q2 and q3 are 2 or more, two or more substituents in the parenthesis are the same as or different from each other.

According to an exemplary embodiment of the present invention, Y4 to Y8 are the same as or different from each other, and are each independently hydrogen, or a substituted or unsubstituted aryl group having 6 to 60 carbon atoms.

According to another exemplary embodiment, Y4 to Y8 are the same as or different from each other, and are each independently hydrogen, or a substituted or unsubstituted aryl group having 6 to 30 carbon atoms.

According to still another exemplary embodiment, Y6 and Y8 are hydrogen.

In yet another exemplary embodiment, Y5 and Y7 are the same as or different from each other, and are each independently hydrogen, a substituted or unsubstituted phenyl group, a substituted or unsubstituted biphenyl group, or a substituted or unsubstituted naphthyl group.

In still yet another exemplary embodiment, Y5 and Y7 are the same as or different from each other, and are each independently hydrogen; a phenyl group which is unsubstituted or substituted with deuterium (D), a halogen group, a cyano group, a silyl group, an alkyl group having 1 to 10 carbon atoms, a cycloalkyl group having 3 to 30 carbon atoms, or an aryl group having 6 to 30 carbon atoms; a biphenyl group which is unsubstituted or substituted with deuterium (D), a halogen group, a cyano group, a silyl group, an alkyl group having 1 to 10 carbon atoms, a cycloalkyl group having 3 to 30 carbon atoms, or an aryl group having 6 to 30 carbon atoms; or a naphthyl group which is unsubstituted or substituted with deuterium (D), a halogen group, a cyano group, a silyl group, an alkyl group having 1 to 10 carbon atoms, a cycloalkyl group having 3 to 30 carbon atoms, or an aryl group having 6 to 30 carbon atoms.

According to a further exemplary embodiment, Y5 and Y7 are the same as or different from each other, and are each independently hydrogen; a phenyl group which is unsubstituted or substituted with a cyclohexyl group, a phenyl group, or a naphthyl group; a biphenyl group which is unsubstituted or substituted with deuterium, fluorine, a cyano group, or a trimethylsilyl group; or a naphthyl group which is unsubstituted or substituted with a methyl group, a phenyl group, or a naphthyl group.

According to an exemplary embodiment of the present invention, Y4 is hydrogen; a substituted or unsubstituted phenyl group; or a substituted or unsubstituted naphthyl group.

According to another exemplary embodiment, Y4 is hydrogen; a phenyl group which is unsubstituted or substituted with deuterium, an alkyl group having 1 to 10 carbon atoms, or an aryl group having 6 to 30 carbon atoms; or a naphthyl group which is unsubstituted or substituted with deuterium, an alkyl group having 1 to 10 carbon atoms, or an aryl group having 6 to 30 carbon atoms.

In still another exemplary embodiment, Y4 is hydrogen; a phenyl group which is unsubstituted or substituted with deuterium; or a naphthyl group which is unsubstituted or substituted with a methyl group.

According to an exemplary embodiment of the present specification, Y9 is a substituted or unsubstituted heterocyclic group having 2 to 60 carbon atoms.

According to another exemplary embodiment, Y9 is a substituted or unsubstituted heterocyclic group having 2 to 30 carbon atoms.

In still another exemplary embodiment, Y9 is a substituted or unsubstituted dibenzofuran group; a substituted or unsubstituted naphthobenzofuran group; a substituted or unsubstituted thiophene group; or a substituted or unsubstituted indolocarbazole group.

According to yet another exemplary embodiment, Y9 is a dibenzofuran group which is unsubstituted or substituted with deuterium, an alkyl group having 1 to 10 carbon atoms, or an aryl group having 6 to 30 carbon atoms; a naphthobenzofuran group which is unsubstituted or substituted with deuterium, an alkyl group having 1 to 10 carbon atoms, or an aryl group having 6 to 30 carbon atoms; a thiophene group which is unsubstituted or substituted with deuterium, an alkyl group having 1 to 10 carbon atoms, or an aryl group having 6 to 30 carbon atoms; or an indolocarbazole group which is unsubstituted or substituted with deuterium, an alkyl group having 1 to 10 carbon atoms, or an aryl group having 6 to 30 carbon atoms.

In still yet another exemplary embodiment, Y9 is a dibenzofuran group; a naphthobenzofuran group; a thiophene group which is substituted with a phenyl group; or an indolocarbazole group.

According to an exemplary embodiment of the present invention, L4 to L9 are the same as or different from each other, and are each independently a direct bond; a substituted or unsubstituted arylene group; or a substituted or unsubstituted heteroarylene group.

In another exemplary embodiment, L4 to L9 are the same as or different from each other, and are each independently a direct bond; a substituted or unsubstituted arylene group having 6 to 60 carbon atoms; or a substituted or unsubstituted heteroarylene group having 2 to 60 carbon atoms.

According to still another exemplary embodiment, L4 to L9 are the same as or different from each other, and are each independently a direct bond; a substituted or unsubstituted arylene group having 6 to 30 carbon atoms; or a substituted or unsubstituted heteroarylene group having 2 to 30 carbon atoms.

According to yet another exemplary embodiment, L4 to L9 are the same as or different from each other, and are each independently a direct bond; or a substituted or unsubstituted arylene group having 6 to 30 carbon atoms.

In still yet another exemplary embodiment, L4 to L9 are the same as or different from each other, and are each independently a direct bond; a substituted or unsubstituted phenylene group; or a substituted or unsubstituted naphthylene group.

According to a further exemplary embodiment, L4 to L9 are the same as or different from each other, and are each independently a direct bond; a phenylene group; or a naphthylene group.

According to an exemplary embodiment of the present invention, R102 and R103 are the same as or different from each other, and are each independently hydrogen, deuterium, a halogen group, a cyano group (—CN), a nitro group, a silyl group, a substituted or unsubstituted alkyl group, a substituted or unsubstituted cycloalkyl group, a substituted or unsubstituted phosphine oxide group, a substituted or unsubstituted aryl group, or a substituted or unsubstituted heterocyclic group.

According to another exemplary embodiment, R102 and R103 are the same as or different from each other, and are each independently hydrogen, deuterium, a halogen group, a cyano group (—CN), a nitro group, a silyl group, a substituted or unsubstituted alkyl group having 1 to 20 carbon atoms, a substituted or unsubstituted cycloalkyl group having 3 to 30 carbon atoms, a substituted or unsubstituted phosphine oxide group, a substituted or unsubstituted aryl group having 6 to 30 carbon atoms, or a substituted or unsubstituted heterocyclic group having 2 to 30 carbon atoms.

In still another exemplary embodiment, R102 and R103 are hydrogen.

According to an exemplary embodiment of the present specification, q2 is an integer from 0 to 7, and when q2 is 2 or more, two or more R102s are the same as or different from each other.

According to another exemplary embodiment, q2 is an integer from 0 to 2.

In still another exemplary embodiment, q2 is 0 or 1.

According to an exemplary embodiment of the present specification, q3 is an integer from 0 to 7, and when q3 is 2 or more, two or more R103s are the same as or different from each other.

According to another exemplary embodiment, q3 is an integer from 0 to 2.

According to still another exemplary embodiment, q3 is 0 or 1.

In an exemplary embodiment of the present specification, a compound of Formula 1-B can be any one of the following compounds:

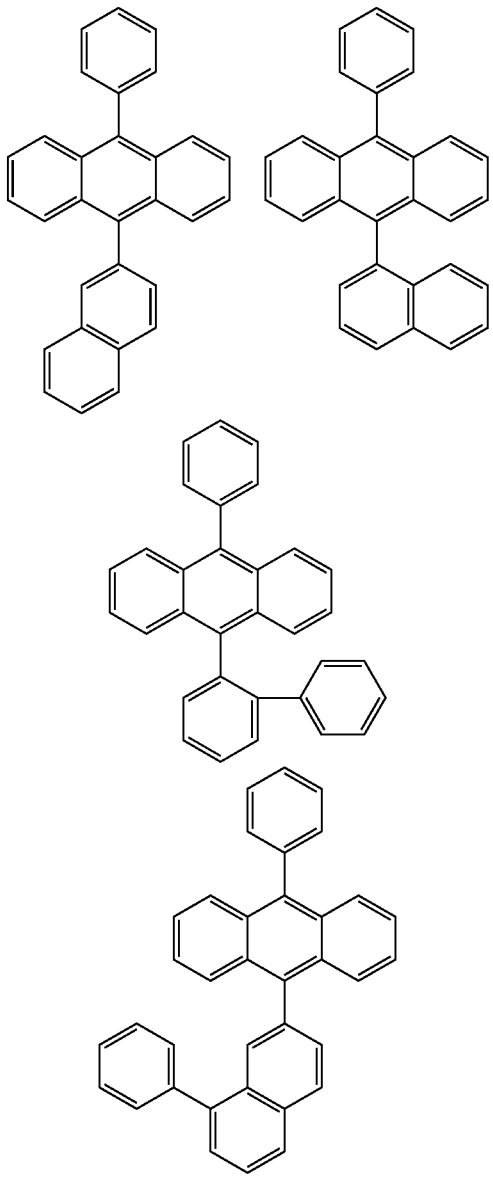

-continued
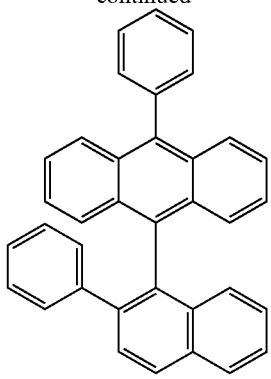
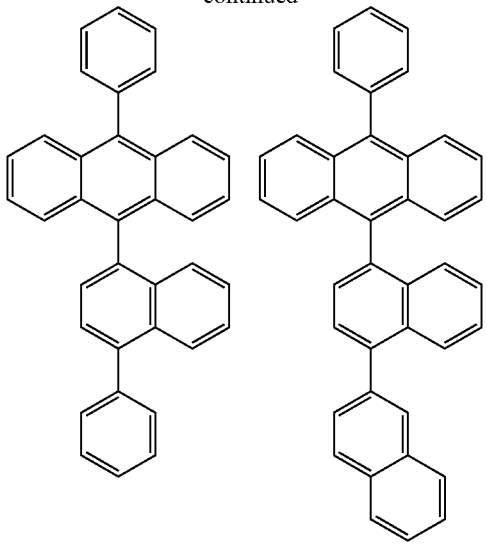
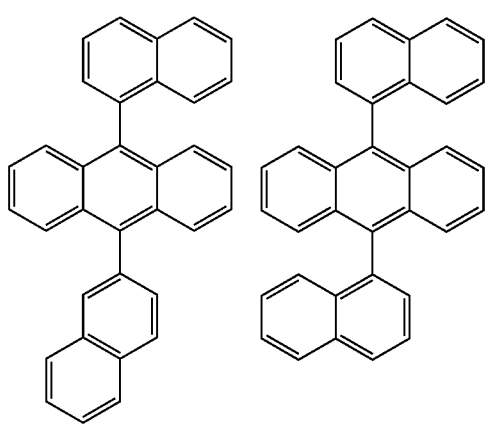
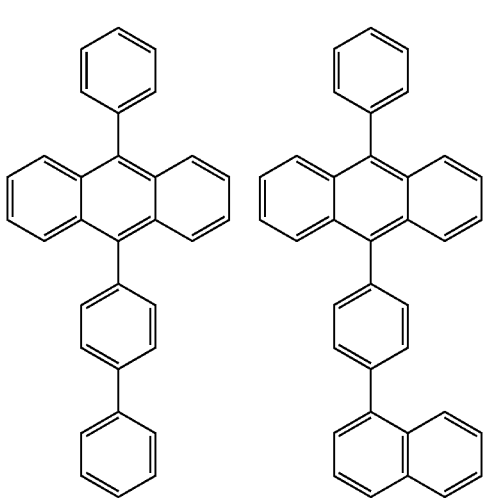
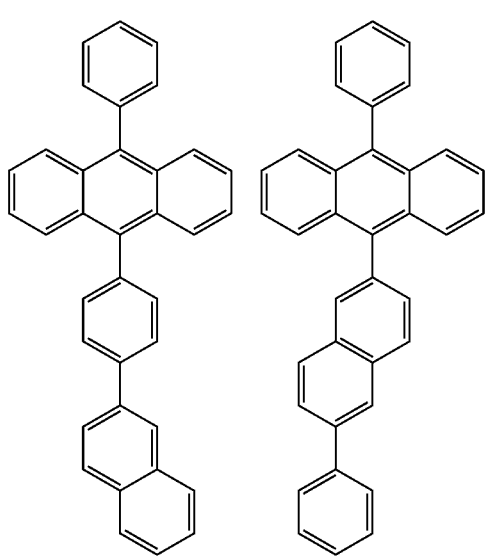
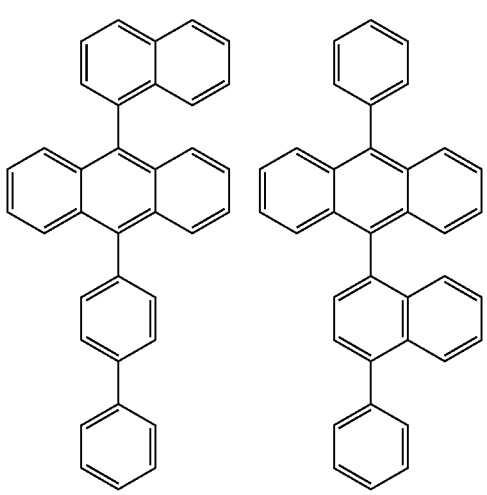

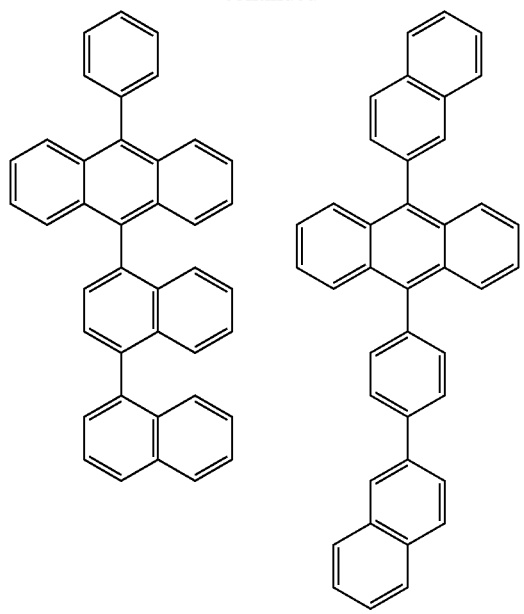
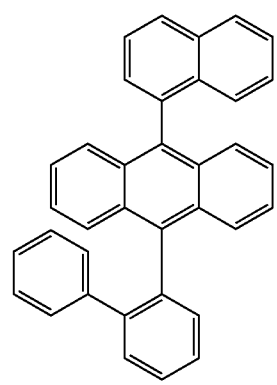 [SMILES: c1ccc(-c2ccccc2-c2c3ccccc3c(-c3cccc4ccccc34)c3ccccc23)cc1]
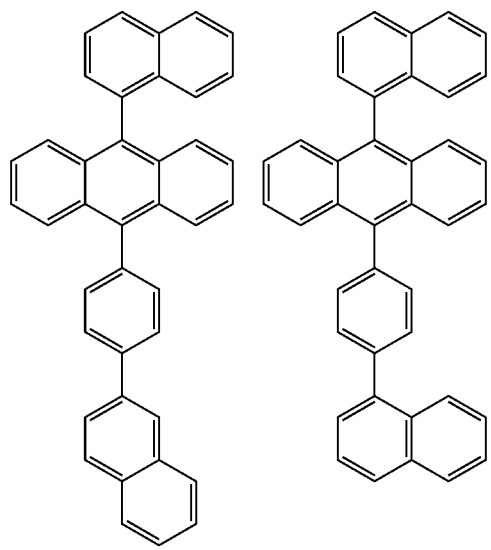
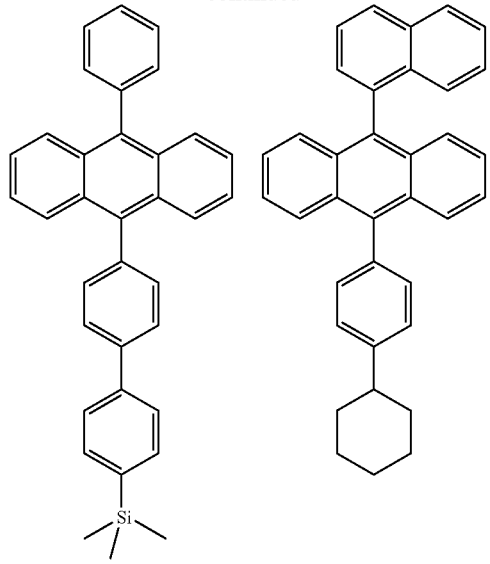
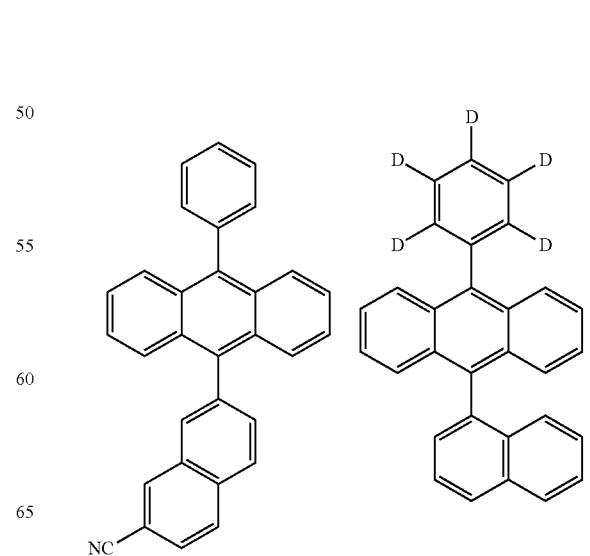

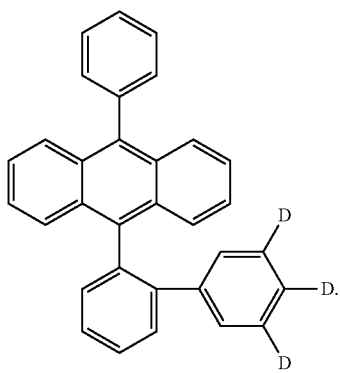
In an exemplary embodiment of the present specification, a compound of Formula 1-C can be any one of the following compounds:
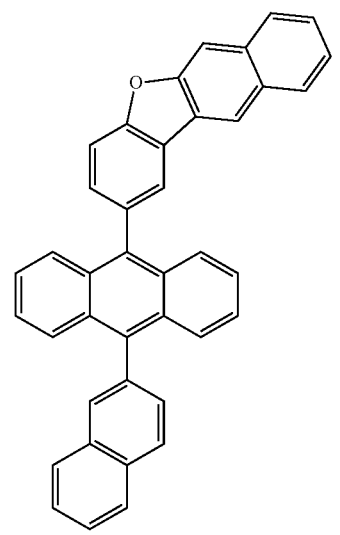
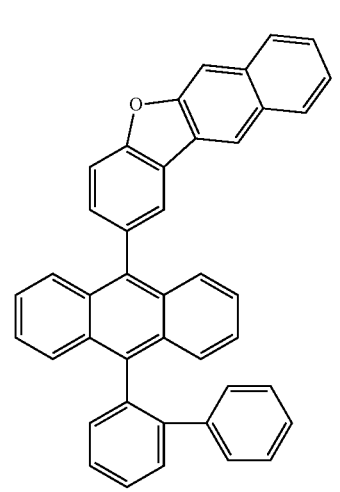
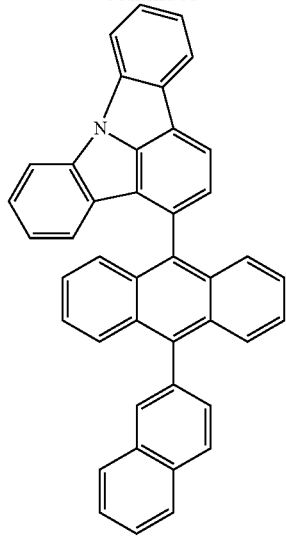
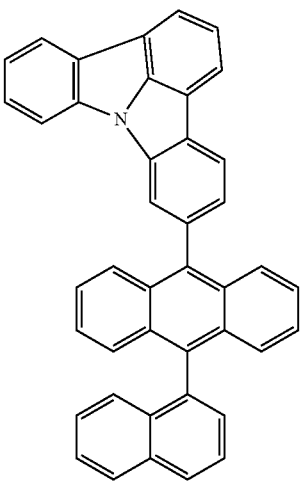
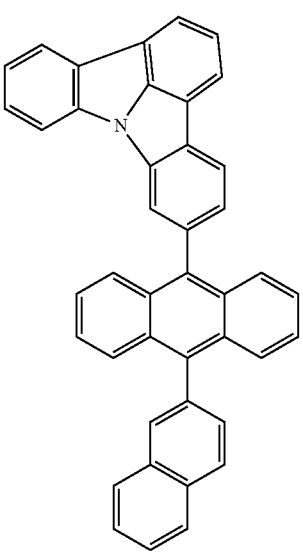

-continued
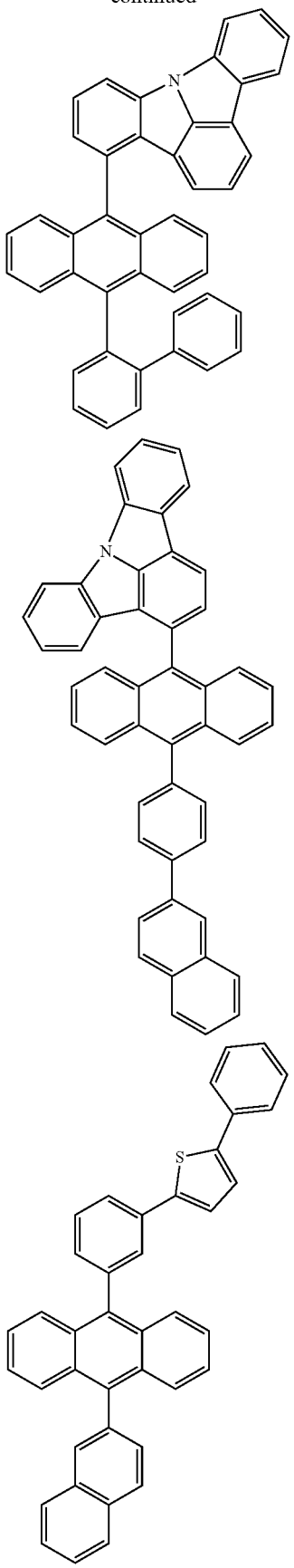
-continued
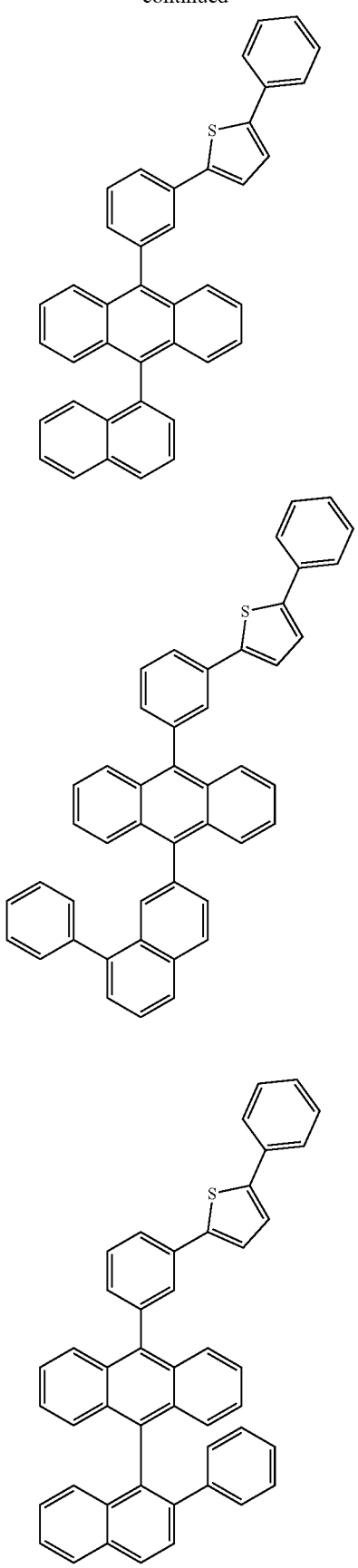

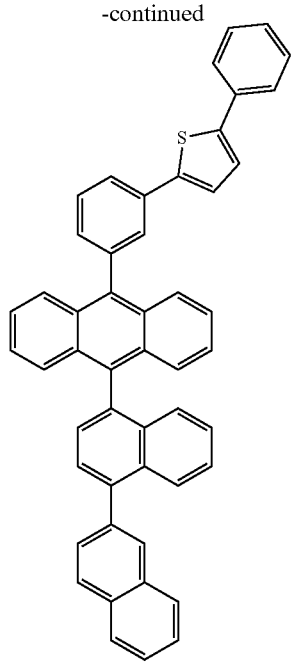
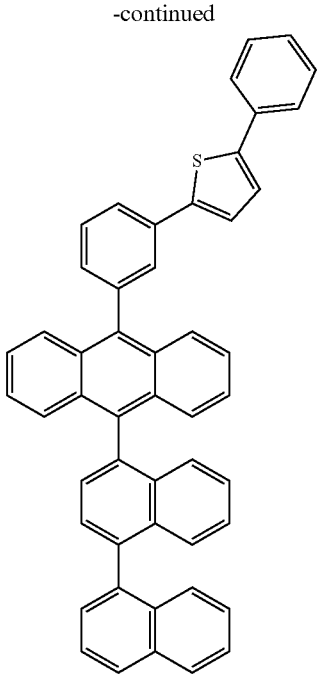
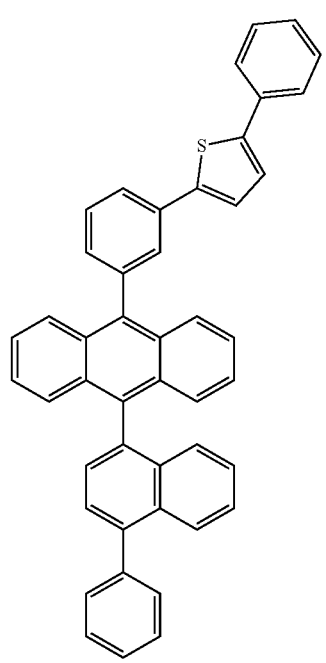
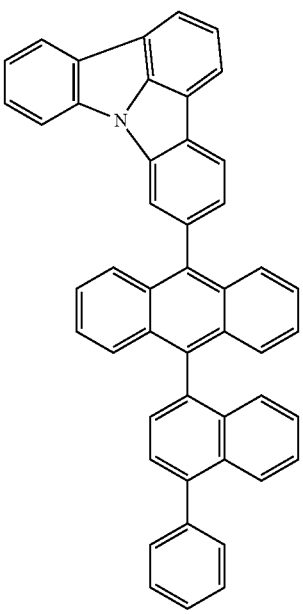

-continued
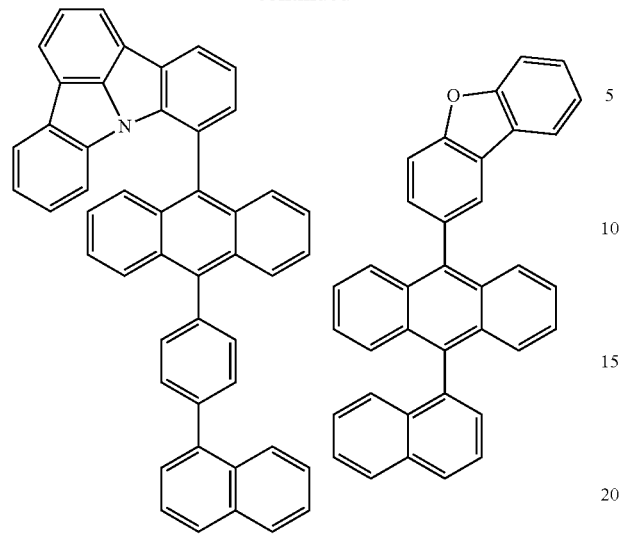
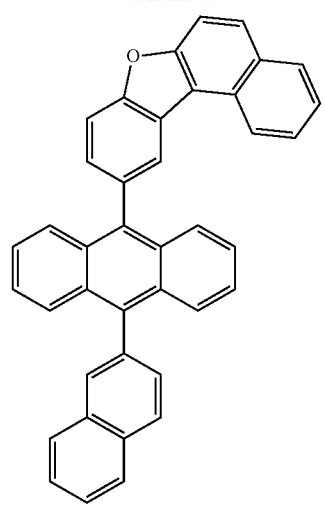
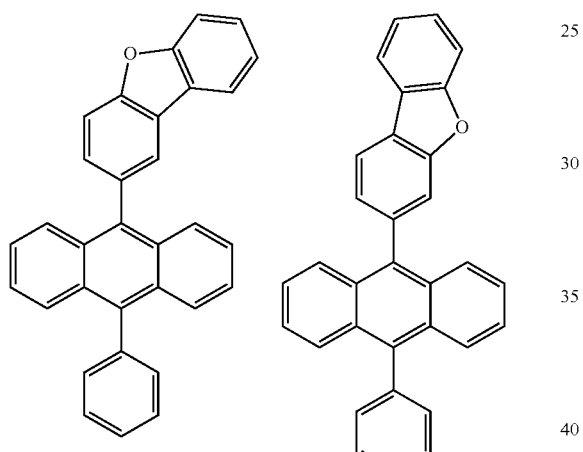
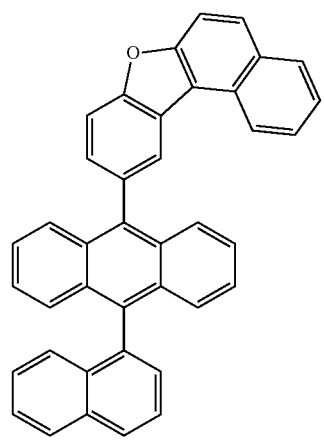
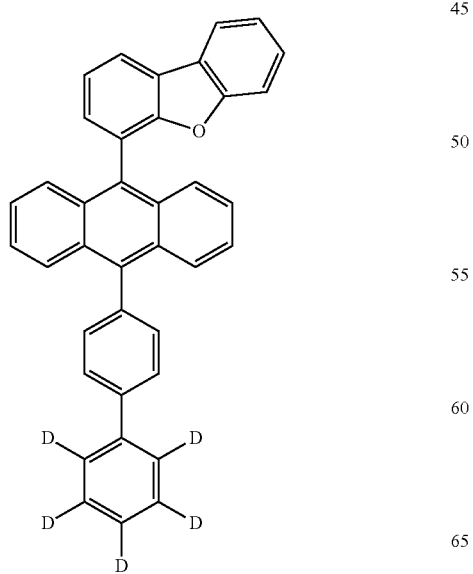
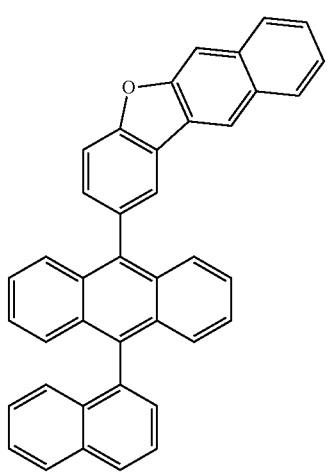

-continued

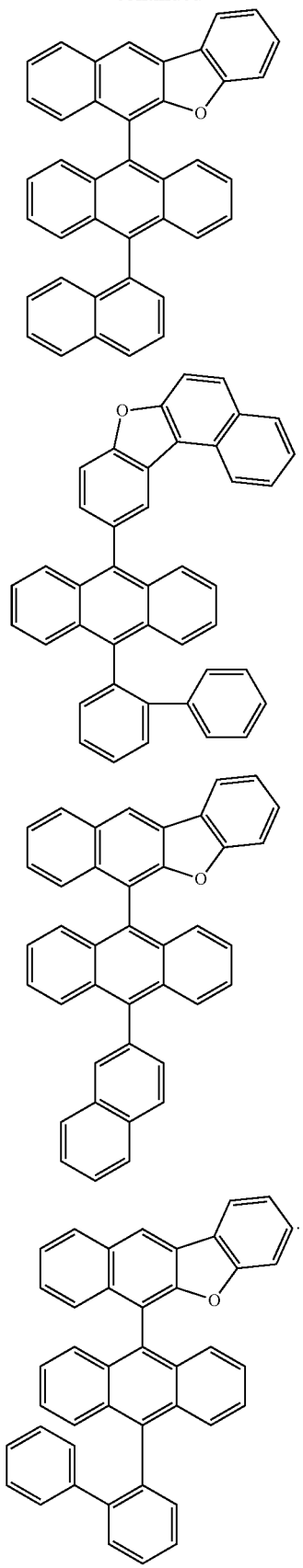

In an exemplary embodiment of the present invention, the organic material layer can include a light emitting layer, the light emitting layer can include the above-described compound as a dopant of the light emitting layer, and when two or more of the compounds of Formulae 1-B and 1-C are included as hosts, the content of the dopant can be 1 part by weight to 10 parts by weight based on 100 parts by weight of the hosts.

According to another exemplary embodiment, the compound can be included as a dopant of the light emitting layer, the compound of Formula 1-B and the compound of Formula 1-C can be included as hosts of the light emitting layer, and a mixed weight ratio (1-B: 1-C) of the hosts can be 95:5 to 5:95.

In still another exemplary embodiment, the organic material layer can include a light emitting layer, and the light emitting layer can include the above-described compound as a dopant of the light emitting layer, include a fluorescent host or a phosphorescent host, and include another organic compound, a metal, or a metal compound as a dopant.

As yet another exemplary embodiment, the organic material layer can include a light emitting layer, and the light emitting layer can include the above-described compound as a dopant of the light emitting layer, include a fluorescent host or a phosphorescent host, and the above-described compound can be used along with an iridium (Ir)-based dopant.

According to still yet another exemplary embodiment, the organic material layer can include a light emitting layer, and the light emitting layer can include the above-described compound as a host of the light emitting layer.

As a further exemplary embodiment, the organic material layer can include a light emitting layer, and the light emitting layer can include the above-described compound as a host of the light emitting layer, and further include a dopant.

In the organic light emitting device of the present invention, the organic material layer can include an electron blocking layer, and the electron blocking layer can include the above-described compound.

In an exemplary embodiment of the present specification, the first electrode is a positive electrode, and the second electrode is a negative electrode.

According to another exemplary embodiment, the first electrode is a negative electrode, and the second electrode is a positive electrode.

The organic light emitting device can have, for example, the following stacking structure, but the stacking structure is not limited thereto.

(1) Positive electrode/Hole transport layer/Light emitting layer/Negative electrode (2) Positive electrode/Hole injection layer/Hole transport layer/Light emitting layer/Negative electrode (3) Positive electrode/Hole injection layer/Hole buffer layer/Hole transport layer/Light emitting layer/Negative electrode (4) Positive electrode/Hole transport layer/Light emitting layer/Electron transport layer/Negative electrode (5) Positive electrode/Hole transport layer/Light emitting layer/Electron transport layer/Electron injection layer/Negative electrode (6) Positive electrode/Hole injection layer/Hole transport layer/Light emitting layer/Electron transport layer/Negative electrode (7) Positive electrode/Hole injection layer/Hole transport layer/Light emitting layer/Electron transport layer/Electron injection layer/Negative electrode (8) Positive electrode/Hole injection layer/Hole buffer layer/Hole transport layer/Light emitting layer/Electron transport layer/Negative electrode
(9) Positive electrode/Hole injection layer/Hole buffer layer/Hole transport layer/Light emitting layer/Electron transport layer/Electron injection layer/Negative electrode
(10) Positive electrode/Hole transport layer/Electron blocking layer/Light emitting layer/Electron transport layer/Negative electrode
(11) Positive electrode/Hole transport layer/Electron blocking layer/Light emitting layer/Electron transport layer/Electron injection layer/Negative electrode
(12) Positive electrode/Hole injection layer/Hole transport layer/Electron blocking layer/Light emitting layer/Electron transport layer/Negative electrode
(13) Positive electrode/Hole injection layer/Hole transport layer/Electron blocking layer/Light emitting layer/Electron transport layer/Electron injection layer/Negative electrode
(14) Positive electrode/Hole transport layer/Light emitting layer/Hole blocking layer/Electron transport layer/Negative electrode
(15) Positive electrode/Hole transport layer/Light emitting layer/Hole blocking layer/Electron transport layer/Electron injection layer/Negative electrode
(16) Positive electrode/Hole injection layer/Hole transport layer/Light emitting layer/Hole blocking layer/Electron transport layer/Negative electrode
(17) Positive electrode/Hole injection layer/Hole transport layer/Light emitting layer/Hole blocking layer/Electron transport layer/Electron injection layer/Negative electrode
(18) Positive electrode/Hole injection layer/Hole transport layer/Light emitting layer/Layer which simultaneously injects and transports electrons/Negative electrode The structure of the organic light emitting device of the present invention can have structures illustrated in FIGS. 1 and 2, but is not limited thereto.

FIG. 1 exemplifies the structure of an organic light emitting device in which a positive electrode 2, a light emitting layer 3, and a negative electrode 4 are sequentially stacked on a substrate 1. In the structure described above, the compound can be included in the light emitting layer 3.

FIG. 2 exemplifies the structure of an organic light emitting device in which a positive electrode 2, a hole injection layer 5, a hole transport layer 6, a light emitting layer 7, a layer 8 which simultaneously injects and transports electrons, and a negative electrode 4 are sequentially stacked on a substrate 1. In the structure as described above, the compound can be included in the hole injection layer 5, the hole transport layer 6, the light emitting layer 7, or the layer 8 which simultaneously injects and transports electrons.

For example, the organic light emitting device according to the present invention can be manufactured by depositing a metal or a metal oxide having conductivity, or an alloy thereof on a substrate to form a positive electrode, forming an organic material layer including a hole injection layer, a hole transport layer, a light emitting layer, an electron blocking layer, an electron transport layer, and an electron injection layer thereon, and then depositing a material, which can be used as a negative electrode, thereon, by using a physical vapor deposition (PVD) method such as sputtering or e-beam evaporation. In addition to the method described above, an organic light emitting device can also be made by sequentially depositing a negative electrode material, an organic material layer, and a positive electrode material on a substrate.

The organic material layer can also have a multi-layered structure including a hole injection layer, a hole transport layer, a layer which simultaneously injects and transports electrons, an electron blocking layer, a light emitting layer, an electron transport layer, an electron injection layer, a layer which simultaneously injects and transports holes, and the like, but is not limited thereto, but is not limited thereto and can have a single-layered structure. Further, the organic material layer can be manufactured with a fewer number of layers by a method such as a solvent process, for example, spin coating, dip coating, doctor blading, screen printing, inkjet printing, or a thermal transfer method using various polymer materials, instead of a deposition method.

The positive electrode is an electrode which injects holes, and as a positive electrode material, materials having a high work function are usually preferred so as to facilitate the injection of holes into an organic material layer. Specific examples of the positive electrode material which can be used in the present invention include: a metal, such as vanadium, chromium, copper, zinc, and gold, or an alloy thereof; a metal oxide, such as zinc oxide, indium oxide, indium tin oxide (ITO), and indium zinc oxide (IZO); a combination of metal and oxide, such as Zno:Al or $SnO_2$:Sb; a conductive polymer, such as poly(3-methylthiophene), poly[3,4-(ethylene-1,2-dioxy)thiophene] (PEDOT), polypyrrole, and polyaniline; and the like, but are not limited thereto.

The negative electrode is an electrode which injects electrons, and as a negative electrode material, materials having a low work function are usually preferred so as to facilitate the injection of electrons into an organic material layer. Specific examples of the negative electrode material include: a metal such as magnesium, calcium, sodium, potassium, titanium, indium, yttrium, lithium, gadolinium, aluminum, silver, tin, and lead, or an alloy thereof; a multi-layer structured material, such as LiF/Al or $LiO_2$/Al; and the like, but are not limited thereto.

The hole injection layer is a layer which serves to smoothly inject holes from a positive electrode to a light emitting layer, and a hole injection material is a material which can proficiently receive holes injected from a positive electrode at low voltage, and it is preferred that the highest occupied molecular orbital (HOMO) of the hole injection material is between the work function of the positive electrode material and the HOMO of the peripheral organic material layer. Specific examples of the hole injection material include metal porphyrin, oligothiophene, arylamine-based organic materials, hexanitrile hexaazatriphenylene-based organic materials, quinacridone-based organic materials, perylene-based organic materials, anthraquinone, polyaniline-based and polythiophene-based conductive polymers, and the like, but are not limited thereto. The hole injection layer can have a thickness of 1 to 150 nm. When the hole injection layer has a thickness of 1 nm or more, there is an advantage in that it is possible to prevent hole injection characteristics from deteriorating, and when the hole injection layer has a thickness of 150 nm or less, there is an advantage in that it is possible to prevent a driving voltage from being increased in order to improve the movement of holes due to a large thickness of the hole injection layer.

The hole transport layer can serve to smoothly transport holes. A hole transport material is suitably a material having high hole mobility which can receive holes transported from a positive electrode or a hole injection layer and transfer the holes to a light emitting layer. Specific examples thereof include arylamine-based organic materials, conductive polymers, block copolymers having both conjugated portions and non-conjugated portions, and the like, but are not limited thereto.

A hole buffer layer can be additionally provided between a hole injection layer and a hole transport layer, and include hole injection or transport materials known in the art.

An electron blocking layer can be provided between a hole transport layer and a light emitting layer. As the electron blocking layer, the above-described compound or a material known in the art can be used.

The light emitting layer can emit red, green, or blue light, and can be composed of a phosphorescent material or a fluorescent material. The light emitting material is preferably a material which can emit light in a visible light region by accepting and combining holes and electrons from a hole transport layer and an electron transport layer, respectively, and has high quantum efficiency for fluorescence or phosphorescence. Specific examples thereof include: 8-hydroxyquinoline aluminum complexes ($Alq_3$); carbazole-based compounds; dimerized styryl compounds; BAlq; 10-hydroxy-benzoquinoline-metal compounds; benzoxazole-based, benzothiazole-based and benzimidazole-based compounds; poly(p-phenylenevinylene) (PPV)-based polymers; spiro compounds; polyfluorene, rubrene, and the like, but are not limited thereto.

Examples of a host material for a light emitting layer include a fused aromatic ring derivative, or a hetero ring-containing compound, and the like. Specifically, examples of the fused aromatic ring derivative include anthracene derivatives, pyrene derivatives, naphthalene derivatives, pentacene derivatives, phenanthrene compounds, fluoranthene compounds, and the like, and examples of the hetero ring-containing compound include carbazole derivatives, dibenzofuran derivatives, ladder-type furan compounds, pyrimidine derivatives, and the like, but the examples thereof are not limited thereto.

When a light emitting layer emits red light, it is possible to use a phosphorescent material such as bis(1-phenylisoquinoline) acetylacetonate iridium (PIQIr (acac)), bis(1-phenylquinoline) acetylacetonate iridium (PQIr (acac)), tris(1-phenylquinoline) iridium (PQIr), or octaethylporphyrin platinum (PtOEP), or a fluorescent material such as tris(8-hydroxyquinolino)aluminum ($Alq_3$), as a light emitting dopant, but the light emitting dopant is not limited thereto. When a light emitting layer emits green light, it is possible to use a phosphorescent material such as fac-tris(2-phenylpyridine) iridium (Ir $(ppy)_3$), or a fluorescent material such as tris(8-hydroxyquinolino)aluminum ($Alq_3$), as the light emitting dopant, but the light emitting dopant is not limited thereto. When a light emitting layer emits blue light, it is possible to use a phosphorescent material such as (4,6-$F_2ppy)_2$Irpic, or a fluorescent material such as spiro-DPVBi, spiro-6P, distyrylbenzene (DSB), distyrylarylene (DSA), a PFO-based polymer or a PPV-based polymer, as the light emitting dopant, but the light emitting dopant is not limited thereto.

A hole blocking layer can be provided between an electron transport layer and a light emitting layer, and materials known in the art can be used.

The electron transport layer can serve to smoothly transport electrons. An electron transport material is suitably a material having high electron mobility which can proficiently receive electrons injected from a negative electrode and transfer the electrons to a light emitting layer. Specific examples thereof include: Al complexes of 8-hydroxyquinoline; complexes including $Alq_3$; organic radical compounds; hydroxyflavone-metal complexes; and the like, but are not limited thereto. The electron transport layer can have a thickness of 1 to 50 nm. When the electron transport layer has a thickness of 1 nm or more, there is an advantage in that it is possible to prevent electron transport characteristics from deteriorating, and when the electron transport layer has a thickness of 50 nm or less, there is an advantage in that it is possible to prevent a driving voltage from being increased in order to improve the movement of electrons due to a large thickness of the electron transport layer.

The electron injection layer can serve to smoothly inject electrons. An electron injection material is preferably a compound which has a capability of transporting electrons, an effect of injecting electrons from a negative electrode, and an excellent effect of injecting electrons into a light emitting layer or a light emitting material, prevents excitons produced from the light emitting layer from moving to a hole injection layer, and is also excellent in the ability to form a thin film. Specific examples thereof include fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, metal complex compounds, nitrogen-containing 5-membered ring derivatives, and the like, but are not limited thereto.

Examples of the metal complex compounds include 8-hydroxyquinolinato lithium, bis(8-hydroxyquinolinato) zinc, bis(8-hydroxyquinolinato) copper, bis(8-hydroxy-quinolinato) manganese, tris(8-hydroxyquinolinato) aluminum, tris(2-methyl-8-hydroxyquinolinato) aluminum, tris(8-hydroxyquinolinato) gallium, bis(10-hydroxybenzo-[h] quinolinato) beryllium, bis(10-hydroxybenzo[h]-quinolinato) zinc, bis(2-methyl-8-quinolinato) chlorogallium, bis(2-methyl-8-quinolinato) (o-cresolato) gallium, bis(2-methyl-8-quinolinato) (1-naphtholato) aluminum, bis(2-methyl-8-quinolinato) (2-naphtholato) gallium, and the like, but are not limited thereto.

The hole blocking layer is a layer which blocks holes from reaching a negative electrode, and can be generally formed under the same conditions as those of the hole injection layer. Specific examples thereof include oxadiazole derivatives or triazole derivatives, phenanthroline derivatives, BCP, aluminum complexes, and the like, but are not limited thereto.

The organic light emitting device according to the present invention can be a top emission type, a bottom emission type, or a dual emission type according to the material to be used.

EXAMPLES

Hereinafter, the present specification will be described in detail with reference to Examples in order to specifically explain the present specification. However, the Examples according to the present specification can be modified in various forms, and it is not interpreted that the scope of the present application is limited to the Examples described in detail below. The Examples of the present application are provided for more completely explaining the present specification to the person with ordinary skill in the art.

Synthesis Examples

Synthesis Example 1

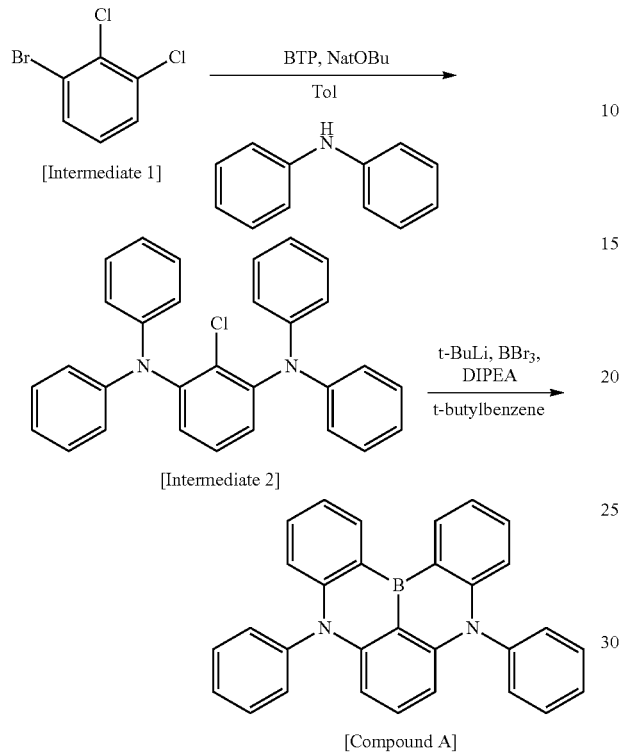

[Intermediate 1]

[Intermediate 2]

[Compound A]

1) Synthesis of Intermediate 2

After 10 g (44 mmol) of 1-bromo-2,3-dichlorobenzene was dissolved in 100 mL of toluene, Intermediate 2 (2-chloro-N1, N1, N3, N3-tetraphenylbenzene-1,3-diamine) was synthesized by putting diphenylamine (2.1 eq, 92 mmol), sodium t-butoxide (2.7 eq, 120 mmol), and bis(tri-tert-butylphosphine) palladium (0) (BTP) (10 mol %) thereinto and refluxing and stirring the resulting mixture for 3 hours. The obtained Intermediate 2 was purified using column chromatography.

Intermediate 2: m/z=446.15 ($C_{30}H_{23}ClN_2$)

Yield=15 g (75.8%), Purity=99.5%

2) Synthesis of Compound A 10 g (22 mmol) of Intermediate 2 was dissolved in 100 mL of t-butylbenzene, and then cooled to −78° ° C. t-Butyl-lithium (2.0 eq, 44 mmol) was injected thereinto, and the resulting mixture was stirred for 6 hours. BBr₃ (2.0 eq, 44 mmol) was injected thereinto, and the resulting mixture was stirred for 1 hour, and then warmed to room temperature. After diisopropylethylamine (2.0 eq, 44 mmol) was slowly added dropwise thereto at room temperature, the resulting mixture was refluxed and stirred for 2 hours. After the reaction was completed, the product was washed with an aqueous KOAc solution and the organic layer was distilled under reduced pressure. The obtained solid was purified with recrystallization to obtain Compound A. A 1H-NMR measurement graph (in DMSO, 400 MHZ) of Compound A is illustrated in FIG. 3.

Compound A: m/z=420.18 ($C_{30}H_{21}BN_2$)

Yield=7.5 g (79.8%), Purity=99.3%

Synthesis Example 2

1) Synthesis of Compound B

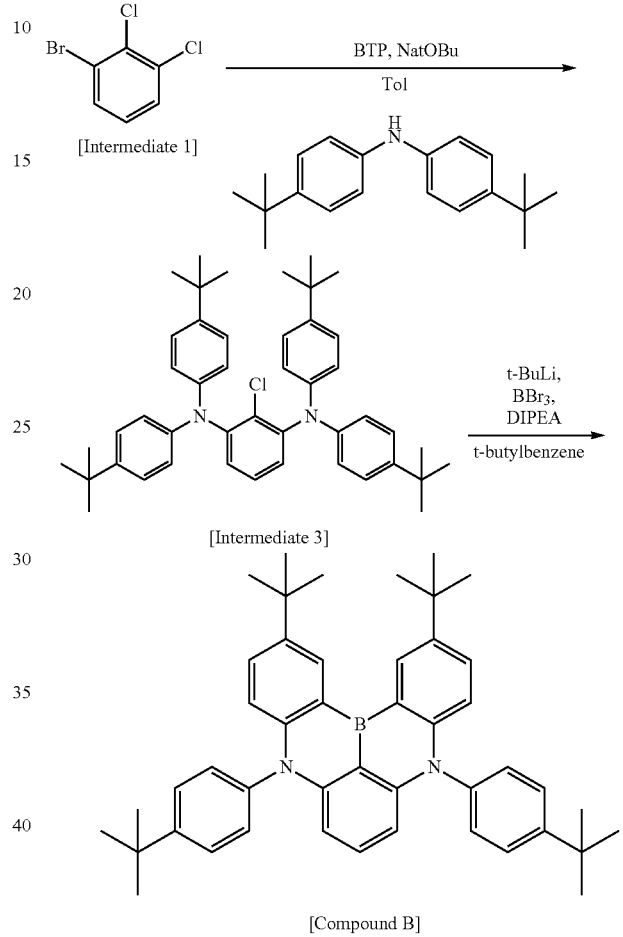

[Intermediate 1]

[Intermediate 3]

[Compound B]

Compound B was synthesized in the same manner as in Synthesis Example 1, except that the bis(4-(tert-butyl)-phenyl)amine was used instead of diphenylamine in Synthesis Example 1. A 1H-NMR measurement graph (in DMSO, 400 MHZ) of Compound B is illustrated in FIG. 4.

Compound B: m/z=644.43 ($C_{46}H_{53}BN_2$)

Yield=7.2 g (75%), Purity=99.6%

Synthesis Example 3

1) Synthesis of Compound 1

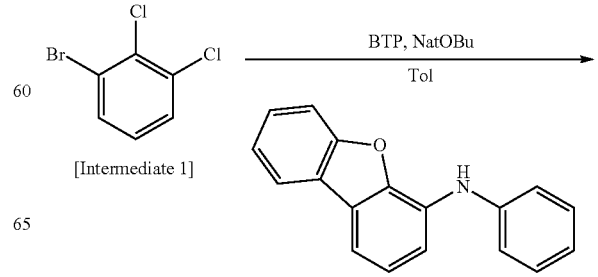

[Intermediate 1]

-continued

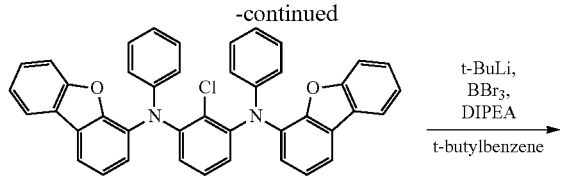

[Intermediate 4]

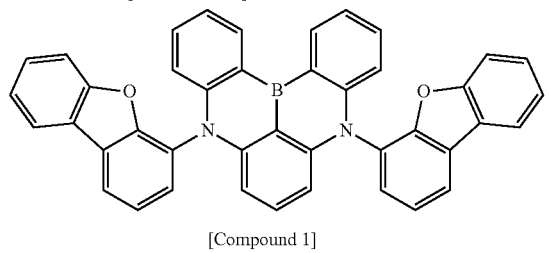

[Compound 1]

Compound 1 was synthesized in the same manner as in Synthesis Example 1, except that the N-phenyldibenzo-[b,d]furan-4-amine was used instead of diphenylamine in Synthesis Example 1. A 1H-NMR measurement graph (in DMSO, 400 MHz) of Compound 1 is illustrated in FIG. 5.

Compound 1: m/z=600.20 ($C_{42}H_{25}BN_2O_2$)

Yield=6.8 g (71.1%), Purity=99.3%

Compound 2 was synthesized in the same manner as in Synthesis Example 1, except that the N-phenyldibenzo-[b,d]furan-3-amine was used instead of diphenylamine in Synthesis Example 1.

Compound 2: m/z=600.20 ($C_{42}H_{25}BN_2O_2$)

Yield=8.2 g (85.7%), Purity=99.5%

Synthesis Example 5

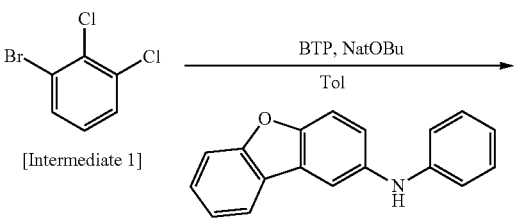

Synthesis Example 4

1) Synthesis of Compound 2

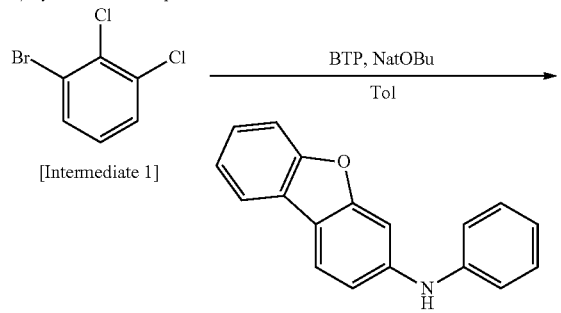

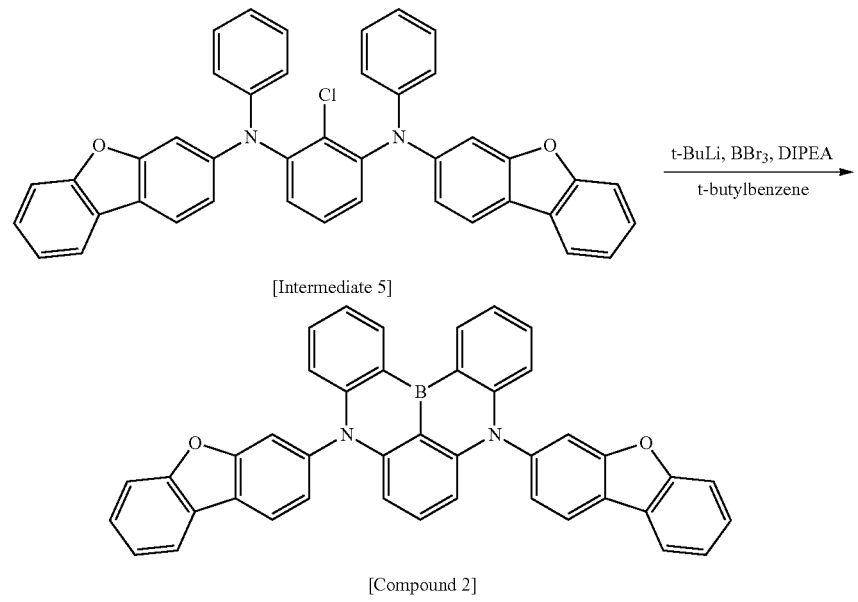

[Intermediate 5]

[Compound 2]

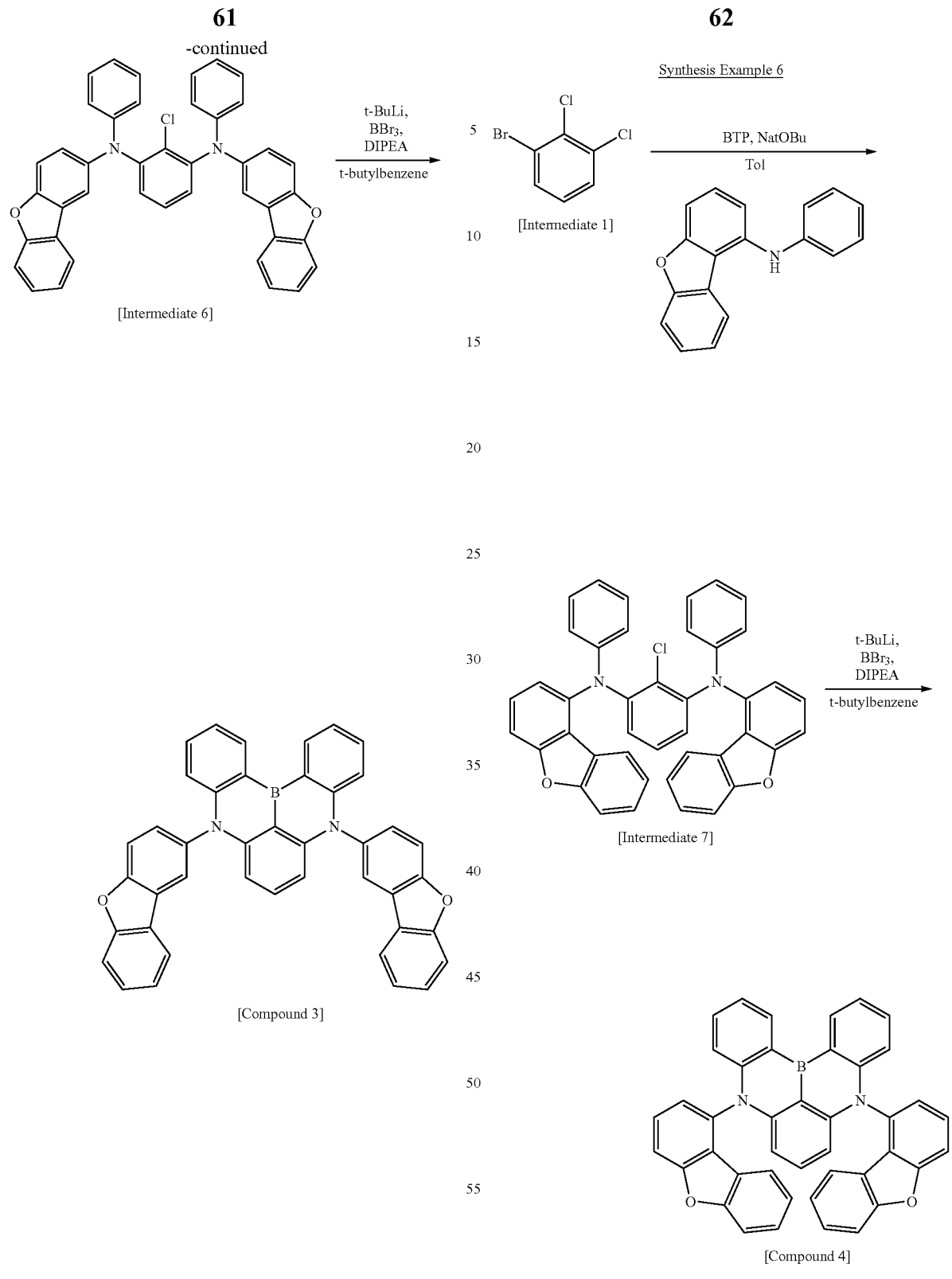

Compound 3 was synthesized in the same manner as in Synthesis Example 1, except that the N-phenyldibenzo-[b,d]furan-2-amine was used instead of diphenylamine in Synthesis Example 1.

Compound 3: m/z=600.20 (C₄₂H₂₅BN₂O₂)

Yield=8.8 g (92%), Purity=99.1%

Compound 4 was synthesized in the same manner as in Synthesis Example 1, except that the N-phenyldibenzo-[b,d]furan-1-amine was used instead of diphenylamine in Synthesis Example 1.

Compound 4: m/z=600.20 (C₄₂H₂₅BN₂O₂)

Yield=7.7 g (80.5%), Purity=99.4%

Synthesis Example 7

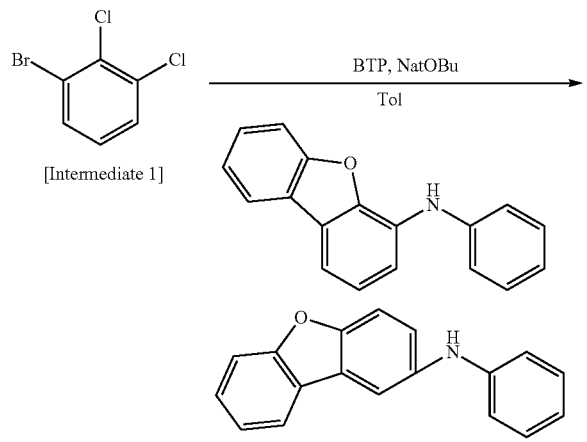

[Intermediate 1]

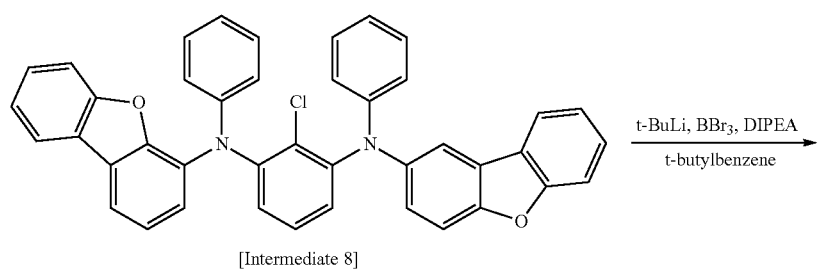

[Intermediate 8]

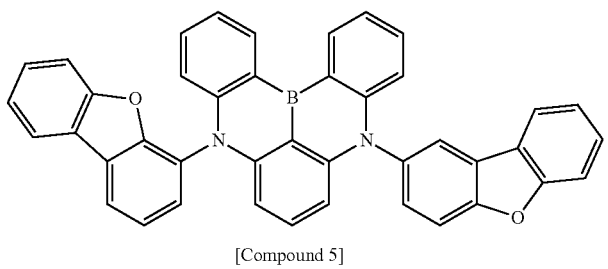

[Compound 5]

Compound 5 was synthesized in the same manner as in Synthesis Example 1, except that the N-phenyldibenzo-[b, d]furan-4-amine and the N-phenyldibenzo[b, d]furan-2-amine were used instead of diphenylamine in Synthesis Example 1. A 1H-NMR measurement graph (in DMSO, 400 MHZ) of Compound 5 is illustrated in FIG. 6.

Compound 5: m/z=600.20 ($C_{42}H_{25}BN_2O_2$)

Yield=7.1 g (74.3%), Purity=99.2%

Synthesis Example 8

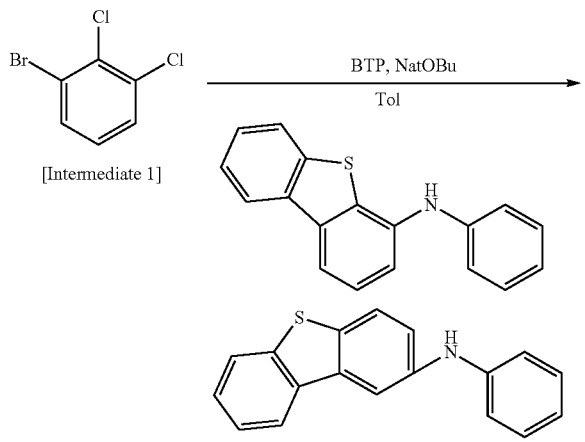

[Intermediate 1]

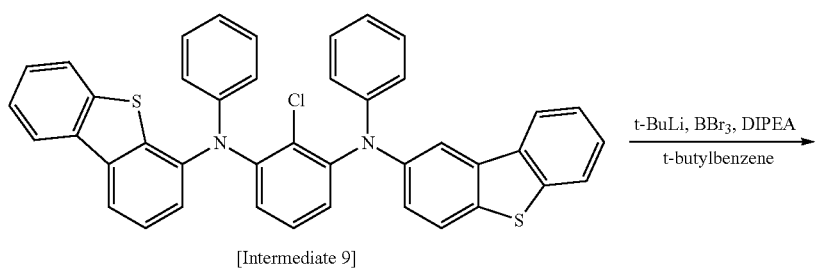

[Intermediate 9]

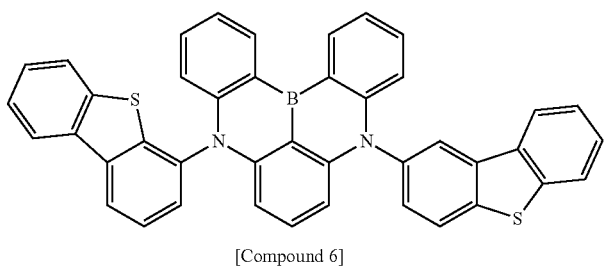

[Compound 6]

Compound 6 was synthesized in the same manner as in Synthesis Example 1, except that the N-phenyldibenzo-[b, d]thiophen-4-amine and N-phenyldibenzo[b, d]thiophen-2-amine were used instead of diphenylamine in Synthesis Example 1. A 1H-NMR measurement graph (in DMSO, 400 MHZ) of Compound 6 is illustrated in FIG. 7.

Compound 6: m/z=632.16 ($C_{42}H_{25}BN_2S_2$)

Yield=7.1 g (78.3%), Purity=99.4%

Synthesis Example 9

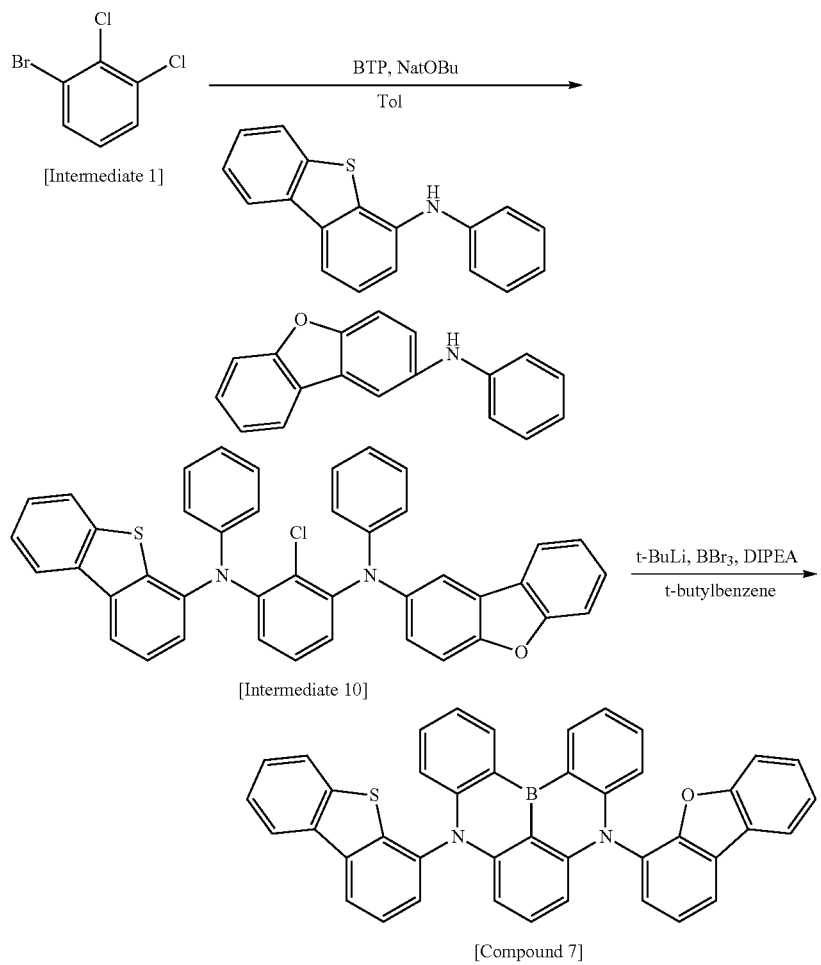

[Compound 7]

Compound 7 was synthesized in the same manner as in Synthesis Example 1, except that N-phenyldibenzo-[b, d]thiophen-4-amine and N-phenyldibenzo[b, d]furan-4-amine were used instead of diphenylamine in Synthesis Example 1. A 1H-NMR measurement graph (in DMSO, 400 MHZ) of Compound 7 is illustrated in FIG. 8.

Compound 7: m/z=616.18 ($C_{42}H_{25}BN_2OS$)

Yield=7.1 g (76.3%), Purity=99.2%

EXAMPLES

Example 1

A glass substrate thinly coated with indium tin oxide (ITO) to have a thickness of 1,500 Å was put into distilled water in which a detergent was dissolved, and ultrasonically washed. In this case, a product manufactured by Fischer Co. was used as the detergent, and distilled water, which had been filtered twice with a filter manufactured by Millipore Co., was used as the distilled water. After the ITO was washed for 30 minutes, ultrasonic washing was conducted twice repeatedly using distilled water for 10 minutes. After the washing using distilled water was completed, ultrasonic washing was conducted by using isopropyl alcohol, acetone, and methanol solvents, and the resulting product was dried and then transported to a plasma washing machine. The substrate was cleaned by using oxygen plasma for 5 minutes, and then was transported to a vacuum deposition machine.

Hexanitrile hexaazatriphenylene (HAT) of the following formula was thermally vacuum-deposited to have a thickness of 500 Å on the thus prepared ITO transparent electrode, thereby forming a hole injection layer:

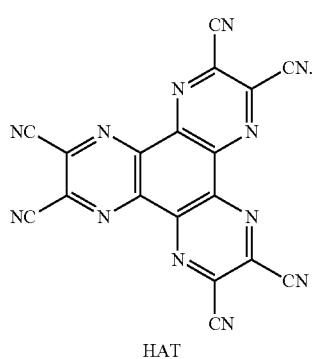 [SMILES: N#Cc1nc2c3nc(C#N)c(C#N)nc3c3nc(C#N)c(C#N)nc3c2nc1C#N ; "HAT"]

HAT 4,4'-bis[N-(1-naphthyl)-N-phenylamino]biphenyl (NPB) (400 Å) of the following formula, which is a material for transporting holes, was vacuum-deposited on the hole injection layer, thereby forming a hole transport layer:

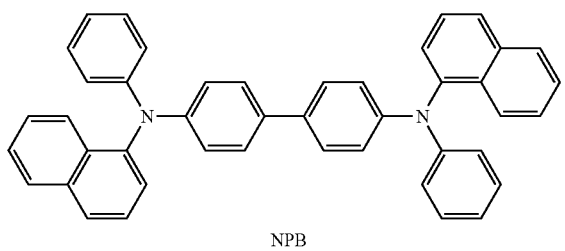 [SMILES: c1ccc(N(c2ccc(-c3ccc(N(c4ccccc4)c4cccc5ccccc45)cc3)cc2)c2cccc3ccccc23)cc1 ; "NPB"]

NPB

Subsequently, 9-(naphthalen-1-yl)-10-(naphthalen-2-yl) anthracene (BH1) of the following formula as a host of a light emitting layer was vacuum-deposited to have a thickness of 300 Å on the hole transport layer, thereby forming a light emitting layer:

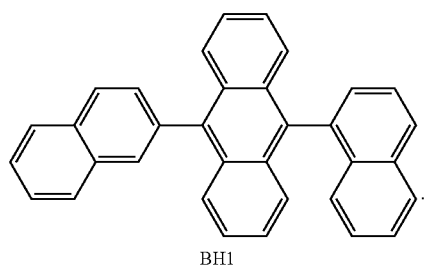

BH1

In this case, 4 wt % of the following Compound 1 as a blue light emitting dopant was used based on the weight of the host of the light emitting layer while depositing the light emitting layer:

Compound 1

Aluminum tris(8-hydroxyquinoline) (Alq₃) of the following formula was vacuum-deposited to have a thickness of 200 Å on the light emitting layer, thereby forming a layer which simultaneously injects and transports electrons:

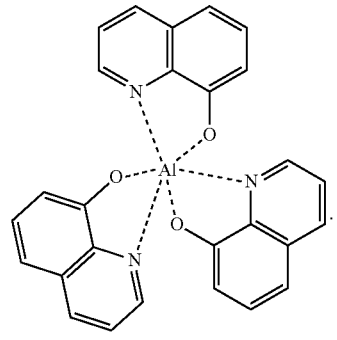

AlQ₃

Lithium fluoride (LiF) and aluminum were sequentially deposited to have thicknesses of 12 Å and 2,000 Å, respectively, on the layer which simultaneously injects and transports electrons, thereby forming a negative electrode.

In the aforementioned procedure, the deposition rate of the organic material was maintained at 0.4 to 0.7 Å/sec, the deposition rates of lithium fluoride and aluminum of the negative electrode were maintained at 0.3 Å/sec and at 2 Å/sec, respectively, and the degree of vacuum during the deposition was maintained at $2 \times 10^{-8}$ to $5 \times 10^{-7}$ torr.

Example 2

A device was manufactured in the same manner as in Example 1, except that the following Compound 2 was used instead of Compound 1 as a blue light emitting dopant in Example 1:

Compound 2

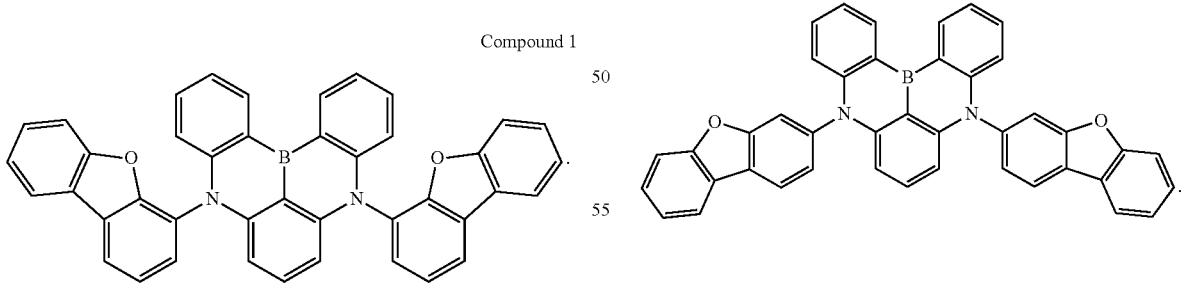

Example 3

A device was manufactured in the same manner as in Example 1, except that the following Compound 3 was used instead of Compound 1 as a blue light emitting dopant in Example 1:

Compound 3

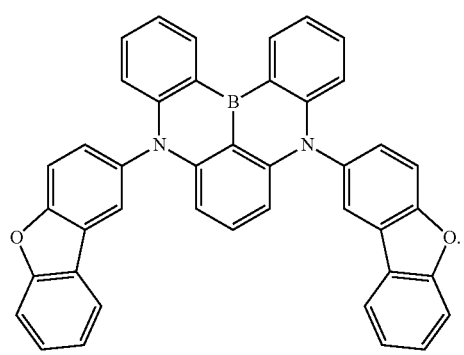

Example 4

A device was manufactured in the same manner as in Example 1, except that the following Compound 4 was used instead of Compound 1 as a blue light emitting dopant in Example 1:

Compound 4

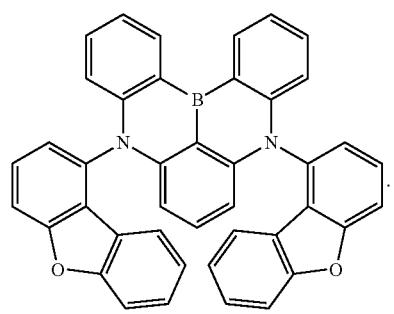

Example 5

A device was manufactured in the same manner as in Example 1, except that the following Compound 5 was used instead of Compound 1 as a blue light emitting dopant in Example 1:

Compound 5

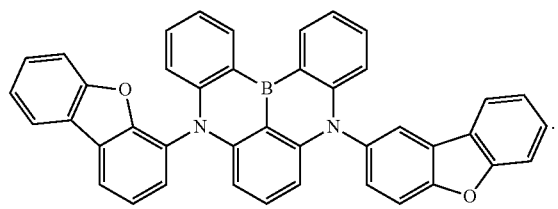

Example 6

A device was manufactured in the same manner as in Example 1, except that the following Compound 6 was used instead of Compound 1 as a blue light emitting dopant in Example 1:

Compound 6

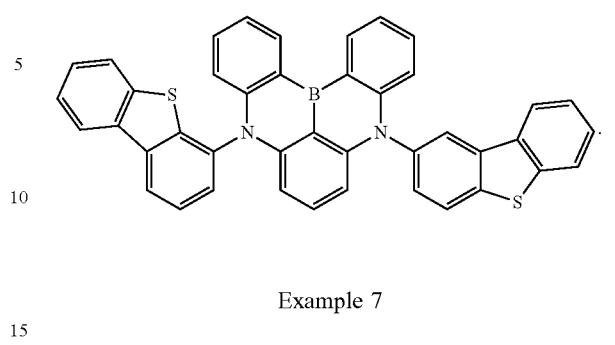

Example 7

A device was manufactured in the same manner as in Example 1, except that the following Compound 7 was used instead of Compound 1 as a blue light emitting dopant in Example 1:

Compound 7

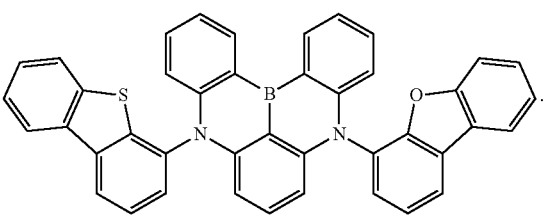

Comparative Example 1

A device was manufactured in the same manner as in Example 1, except that the following Compound A was used instead of Compound 1 as a blue light emitting dopant in Example 1:

Compound A

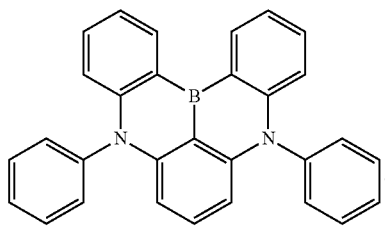

Comparative Example 2

A device was manufactured in the same manner as in Example 1, except that the following Compound B was used instead of Compound 1 as a blue light emitting dopant in Example 1:

Compound B

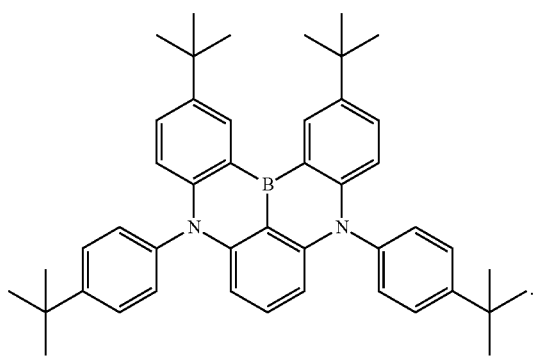

Comparative Example 3

A device was manufactured in the same manner as in Example 1, except that the following Compound C was used instead of Compound 1 as a blue light emitting dopant in Example 1:

Compound C

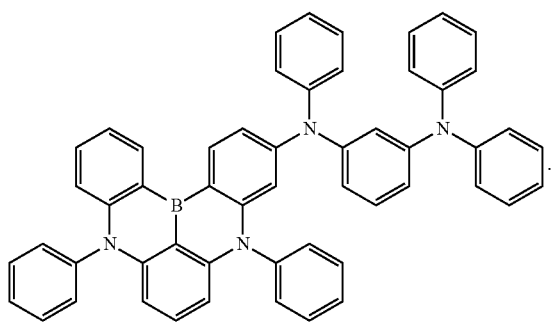

Comparative Example 4

A device was manufactured in the same manner as in Example 1, except that the following Compound D was used instead of Compound 1 as a blue light emitting dopant in Example 1:

Compound D

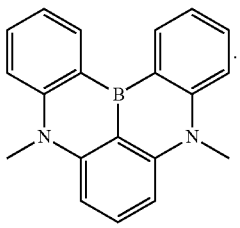

The results of measuring the device performances of the organic light emitting devices manufactured in Examples 1 to 7 and Comparative Examples 1 to 4 are shown in the following Table 1. T97 means the time taken for the luminance to be reduced to 97% compared to the initial luminance.

TABLE 1

| Classification | Dopant | Voltage (eV) | Efficiency (Cd/A) | Service life (T97) |
|---|---|---|---|---|
| Comparative Example 1 | Compound A | 7.22 | 4.21 | 80 |
| Comparative Example 2 | Compound B | 7.29 | 4.32 | 85 |
| Comparative Example 3 | Compound C | 7.25 | 4.44 | 60 |
| Comparative Example 4 | Compound D | 7.19 | 4.15 | 90 |
| Example 1 | Compound 1 | 7.24 | 4.88 | 100 |
| Example 2 | Compound 2 | 7.26 | 4.52 | 110 |
| Example 3 | Compound 3 | 7.26 | 4.66 | 110 |
| Example 4 | Compound 4 | 7.24 | 4.98 | 120 |
| Example 5 | Compound 5 | 7.25 | 4.71 | 115 |
| Example 6 | Compound 6 | 7.27 | 4.88 | 105 |
| Example 7 | Compound 7 | 7.26 | 4.93 | 125 |

From Table 1, it can be confirmed that Examples 1 to 7 in which the compound of the present application is used have better current efficiency and service life characteristic of the device than Comparative Examples 1 to 4.

Specifically, the current efficiency and service life characteristic of Examples 1 to 7 where a compound in which hetero rings Cy1 and Cy2 are fused with a phenyl group bonded to a nitrogen atom, like Formula 1 of the present application, is used are better than current efficiency and service life characteristics of Comparative Examples 1 to 3 where a compound in which Cy1 and Cy2 are not fused is used and Comparative Example 4 where a compound in which a methyl group is bonded to a nitrogen atom of the core structure is used. As described above, preferred exemplary embodiments of the present specification have been described, but the present invention is not limited thereto and can be variously modified and carried out within the scope of the claims and the detailed description of the invention, and the modifications also fall within the scope of the invention.

The invention claimed is:

1. An organic light emitting device comprising:
a first electrode;
a second electrode provided to face the first electrode; and
an organic material layer having one or more layers provided between the first electrode and the second electrode,
wherein the organic material layer comprises a light emitting layer, and the light emitting layer comprises a compound of any one of Formulae 5 to 12 as a dopant of the light emitting layer, and a compound of Formula 1-A as a host:

Formula 5

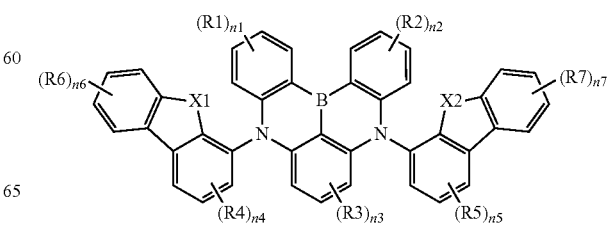

-continued

Formula 6
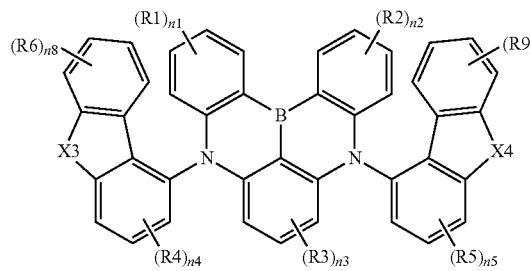

Formula 7
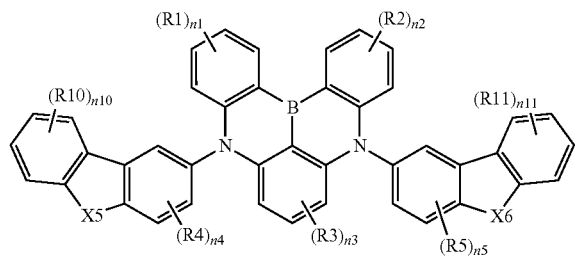

Formula 8
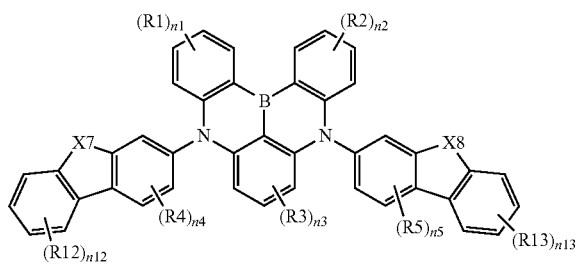

Formula 9
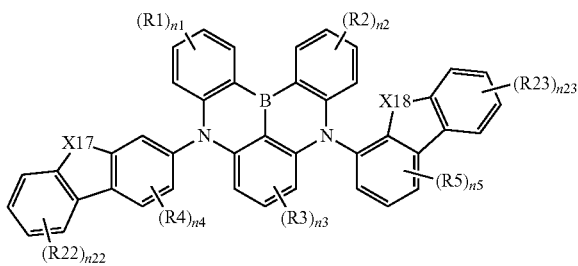

Formula 10
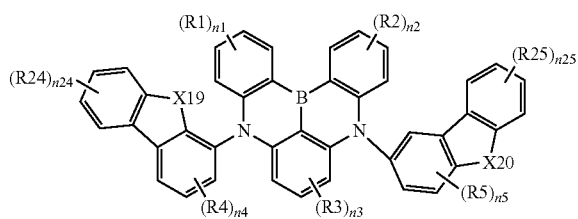

Formula 11
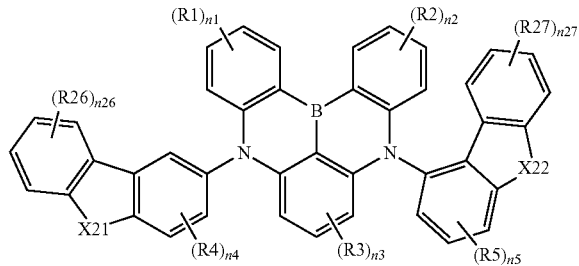

Formula 12
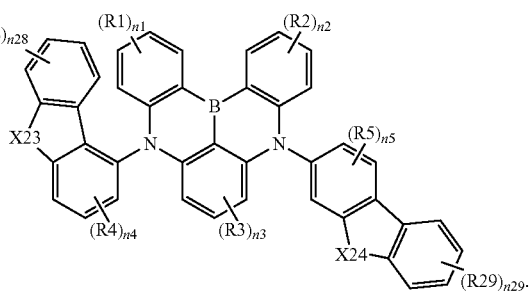

wherein in Formulae 5 to 12:

R1 to R3 are the same as or different from each other, and are each independently hydrogen or deuterium;

R4 and R5 are the same as or different from each other, and are each independently hydrogen, deuterium, a halogen group, a cyano group, a nitro group, a hydroxyl group, a carbonyl group, an ester group, an imide group, an amino group, a silyl group, a boron group, a substituted or unsubstituted alkyl group, a substituted or unsubstituted cycloalkyl group, a substituted or unsubstituted aryl group, or a substituted or unsubstituted heterocyclic group;

n1 and n2 are each an integer from 0 to 4;

n3 to n5 are each an integer from 0 to 3; and when n1 to n5 are each 2 or more, two or more substituents in the parenthesis are the same as or different from each other;

X1 to X8 and X17 to X24 are the same as or different from each other, and are each independently O or S;

R, R6 to R13, and R22 to R29 are the same as or different from each other, and are each independently hydrogen, deuterium, a halogen group, a cyano group, a nitro group, a hydroxyl group, a carbonyl group, an ester group, an imide group, an amino group, a silyl group, a boron group, a substituted or unsubstituted alkyl group, a substituted or unsubstituted cycloalkyl group, a substituted or unsubstituted aryl group, or a substituted or unsubstituted heterocyclic group; and n6 to n13 and n22 to n29 are each an integer from 0 to 4, and when n6 to n13 and n22 to n29 are each 2 or more, two or more substituents in the parenthesis are the same as or different from each other;

Formula 1-A

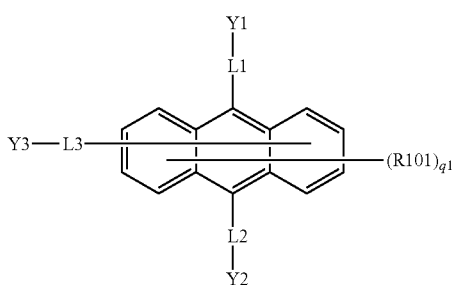

wherein in Formula 1-A:
Y1 is a substituted or unsubstituted naphthobenzofuran group, a substituted or unsubstituted thiophene group, or a substituted or unsubstituted indolocarbazole group;
Y2 and Y3 are the same as or different from each other, and are each independently hydrogen, a substituted or unsubstituted aryl group, or a substituted or unsubstituted heterocyclic group;
L1 to L3 are the same as or different from each other, and are each independently a direct bond, a substituted or unsubstituted arylene group, or a substituted or unsubstituted heteroarylene group;
R101 is hydrogen, deuterium, a halogen group, a cyano group, a nitro group, a silyl group, a substituted or unsubstituted alkyl group, a substituted or unsubstituted cycloalkyl group, a substituted or unsubstituted phosphine oxide group, a substituted or unsubstituted aryl group, or a substituted or unsubstituted heterocyclic group; and
q1 is an integer from 0 to 7, and when q1 is 2 or more, two or more R101s are the same as or different from each other.

2. An organic light emitting device comprising:
a first electrode;
a second electrode provided to face the first electrode; and
an organic material layer having one or more layers provided between the first electrode and the second electrode,
wherein one or more layers of the organic material layer comprise a compound of Formula 1:

Formula 1

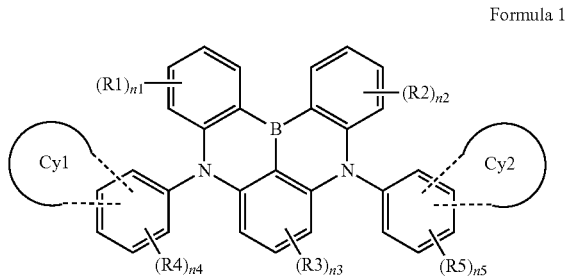

wherein in Formula 1:
Cy1 and Cy2 are the same as or different from each other, and are each independently a substituted or unsubstituted hetero ring;
R1 to R5 are the same as or different from each other, and are each independently hydrogen, deuterium, a halogen group, a cyano group, a nitro group, a hydroxyl group, a carbonyl group, an ester group, an imide group, an amino group, a silyl group, a boron group, a substituted or unsubstituted alkyl group, a substituted or unsubstituted cycloalkyl group, a substituted or unsubstituted aryl group, or a substituted or unsubstituted heterocyclic group;
n1 and n2 are each an integer from 0 to 4;
n3 to n5 are each an integer from 0 to 3; and
when n1 to n5 are each 2 or more, two or more substituents in the parenthesis are the same as or different from each other,
wherein the organic material layer comprises a hole injection layer or a hole transport layer, and the hole injection layer or the hole transport layer comprises the compound of Formula 1.

3. An organic light emitting device comprising:
a first electrode;
a second electrode provided to face the first electrode; and
an organic material layer having one or more layers provided between the first electrode and the second electrode,
wherein one or more layers of the organic material layer comprise a compound of Formula 1:

Formula 1

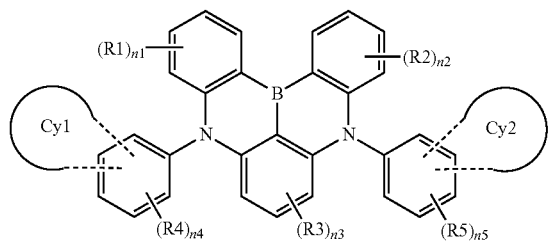

wherein in Formula 1:
Cy1 and Cy2 are the same as or different from each other, and are each independently a substituted or unsubstituted hetero ring;
R1 to R5 are the same as or different from each other, and are each independently hydrogen, deuterium, a halogen group, a cyano group, a nitro group, a hydroxyl group, a carbonyl group, an ester group, an imide group, an amino group, a silyl group, a boron group, a substituted or unsubstituted alkyl group, a substituted or unsubstituted cycloalkyl group, a substituted or unsubstituted aryl group, or a substituted or unsubstituted heterocyclic group;
n1 and n2 are each an integer from 0 to 4;
n3 to n5 are each an integer from 0 to 3; and
when n1 to n5 are each 2 or more, two or more substituents in the parenthesis are the same as or different from each other,
wherein the organic material layer comprises an electron transport layer or an electron injection layer, and the electron transport layer or the electron injection layer comprises the compound of Formula 1.

4. An organic light emitting device comprising:
a first electrode;
a second electrode provided to face the first electrode; and
an organic material layer having one or more layers provided between the first electrode and the second electrode, wherein one or more layers of the organic material layer comprise a compound of Formula 1:

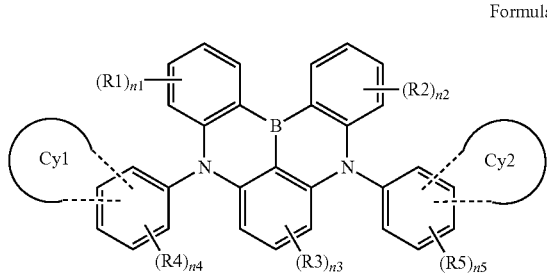

Formula 1 wherein in Formula 1:

Cy1 and Cy2 are the same as or different from each other, and are each independently a substituted or unsubstituted hetero ring;

R1, R2, R4, and R5 are the same as or different from each other, and are each independently hydrogen, deuterium, a halogen group, a cyano group, a nitro group, a hydroxyl group, a carbonyl group, an ester group, an imide group, an amino group, a silyl group, a boron group, a substituted or unsubstituted alkyl group, a substituted or unsubstituted cycloalkyl group, a substituted or unsubstituted aryl group, or a substituted or unsubstituted heterocyclic group;

R3 is deuterium, a hydroxyl group, a carbonyl group, an ester group, an imide group, or a boron group;

n1 and n2 are each an integer from 0 to 4;

n3 to n5 are each an integer from 0 to 3; and when n1 to n5 are each 2 or more, two or more substituents in the parenthesis are the same as or different from each other, wherein the organic material layer comprises a light emitting layer, and the light emitting layer comprises the compound of Formula 1 as a dopant of the light emitting layer, and wherein the light emitting layer further comprises, as a host, two or more compounds selected from among the following Formulae 1-B and 1-C:

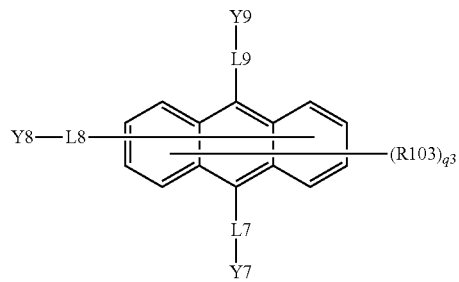

Formula 1-B

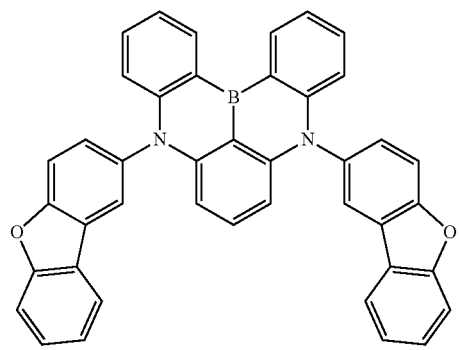

Formula 1-C wherein in Formulae 1-B and 1-C:

Y4 to Y8 are the same as or different from each other, and are each independently hydrogen, or a substituted or unsubstituted aryl group;

Y9 is a substituted or unsubstituted heterocyclic group;

L4 to L9 are the same as or different from each other, and are each independently a direct bond, a substituted or unsubstituted arylene group, or a substituted or unsubstituted heteroarylene group;

R102 and R103 are the same as or different from each other, and are each independently hydrogen, deuterium, a halogen group, a cyano group, a nitro group, a silyl group, a substituted or unsubstituted alkyl group, a substituted or unsubstituted cycloalkyl group, a substituted or unsubstituted phosphine oxide group, a substituted or unsubstituted aryl group, or a substituted or unsubstituted heterocyclic group; and q2 and q3 are each an integer from 0 to 7, and when q2 and q3 are 2 or more, two or more substituents in the parenthesis are the same as or different from each other.

5. The organic light emitting device of claim 1, wherein the compound of any one of Formulae 5 to 12 is any one of the following compounds:

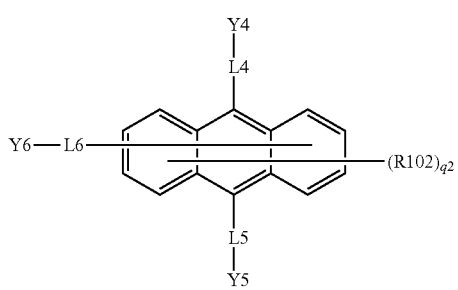

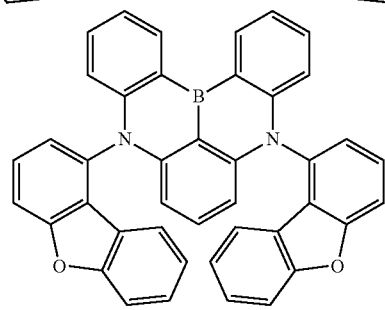

-continued
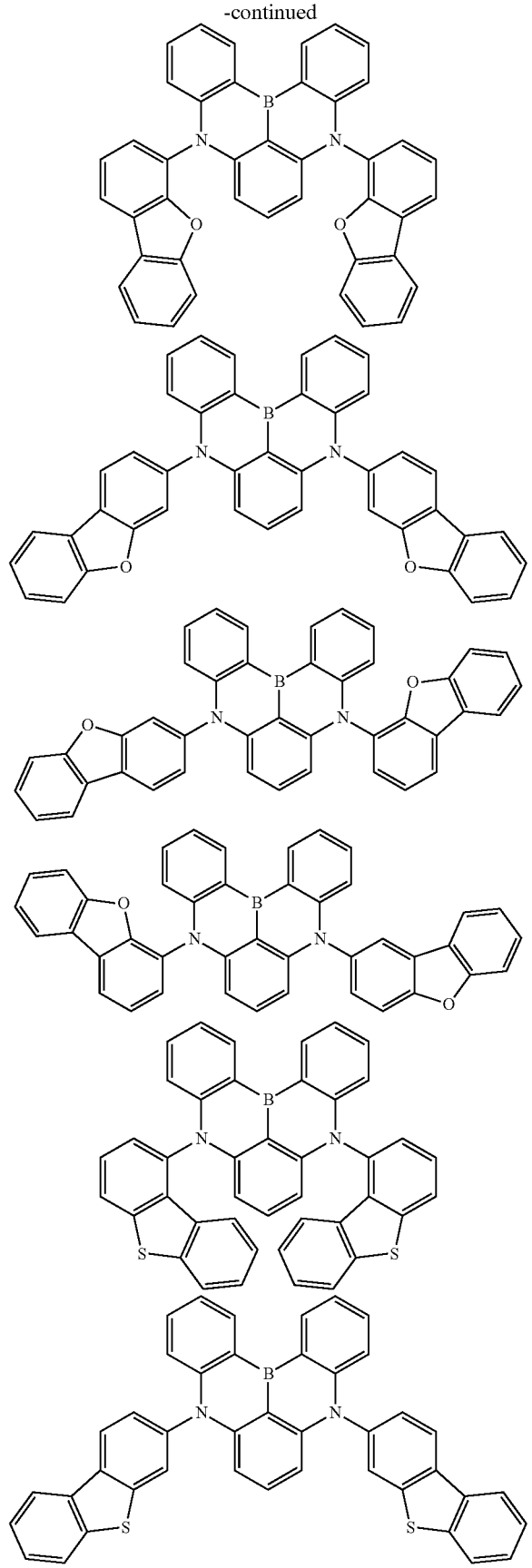
-continued
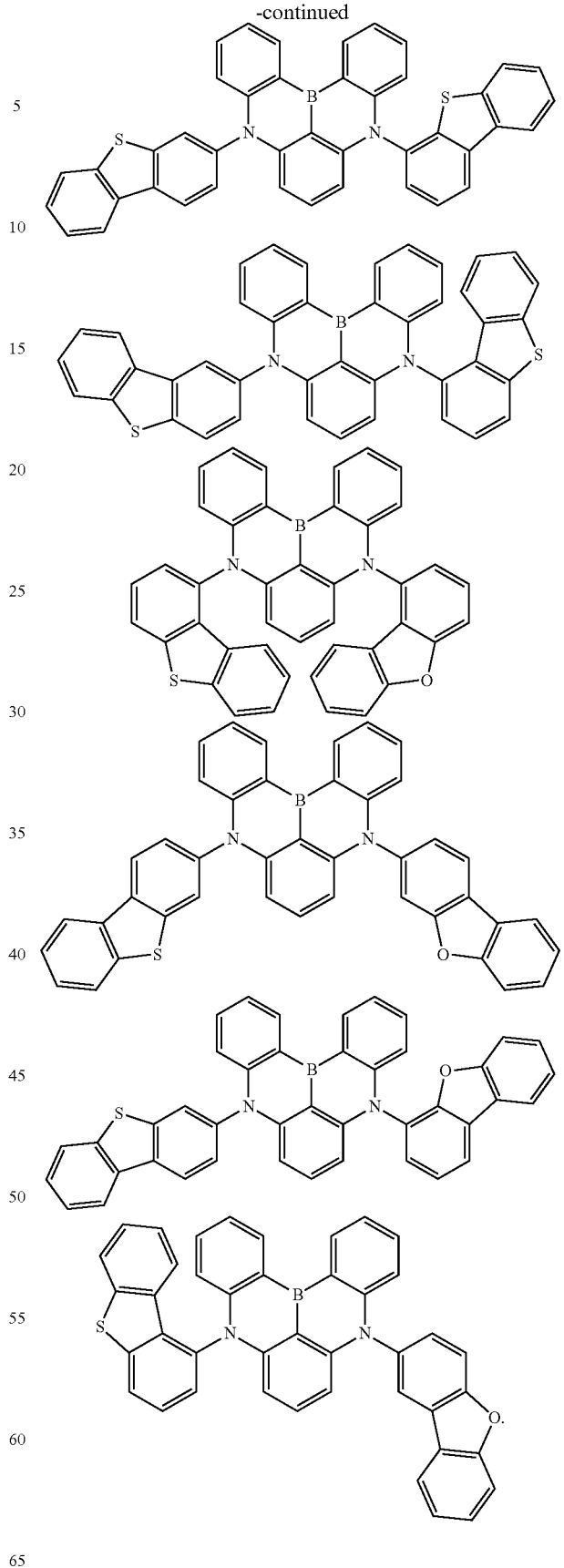
* * * * *